US012686224B2

(12) United States Patent
Igra et al.

(10) Patent No.: US 12,686,224 B2
(45) Date of Patent: *Jul. 21, 2026

(54) PATTERN TRANSFER PRINTING SYSTEMS AND METHODS

(71) Applicant: Wuhan DR Laser Technology Corp,. LTD, Wuhan (CN)

(72) Inventors: Gad Igra, Ness Ziona (IL); Eyal Cohen, Kfar-Saba (IL); Eran Yunger, Moshav Sdei Avraham (IL); Moshe Finarov, Rehovot (IL); Tao Xu, Wuhan (CN); Jing Shi, Wuhan (CN); Weiguo Tong, Wuhan (CN); Zhigang Li, Wuhan (CN)

(73) Assignee: Wuhan DR Laser Technology Corp., LTD, Wuhan (CN)

( * ) Notice: Subject to any disclaimer, the term of this patent is extended or adjusted under 35 U.S.C. 154(b) by 219 days.

This patent is subject to a terminal disclaimer.

(21) Appl. No.: 18/429,655

(22) Filed: Feb. 1, 2024

(65) Prior Publication Data

US 2024/0208242 A1      Jun. 27, 2024

Related U.S. Application Data

(63) Continuation-in-part of application No. 17/583,440, filed on Jan. 25, 2022, now Pat. No. 11,910,537.

(30) Foreign Application Priority Data

| | | |
|---|---|---|
| Nov. 9, 2021 | (CN) | 202111321391.3 |
| Nov. 9, 2021 | (CN) | 202122732445.7 |
| Jan. 19, 2022 | (IL) | 290194 |

(51) Int. Cl.
B41J 2/44        (2006.01)
B41J 2/47        (2006.01)
(Continued)

(52) U.S. Cl.
CPC .............. B41M 5/025 (2013.01); B41J 2/442 (2013.01); B41J 2/471 (2013.01); B41J 2/475 (2013.01); H10F 71/1375 (2025.01)

(58) Field of Classification Search
CPC ....... B41J 2/44; B41J 2/442; B41J 2/47; B41J 2/471; B41J 2/435; B41J 2/475; H10F 71/137; H10F 71/1375; B41M 5/025
See application file for complete search history.

(56) References Cited

U.S. PATENT DOCUMENTS 5,649,774  A  *   7/1997   Harding .................. B41J 33/54
                                                          400/225
6,695,030  B1 *   2/2004   Phillips .................. H10K 71/18
                                                          427/457
(Continued)

FOREIGN PATENT DOCUMENTS

AU        2019/200576        2/2019
CN        101044030          9/2007
(Continued)

OTHER PUBLICATIONS

Lossen et al. (2015), Pattern Transfer Printing (PTP™) for c-Si solar cell metallization, 5th Workshop on Metallization for Crystalline Silicon Solar Cells, Science Direct; Energy Procedia 67:156-162.
(Continued)

*Primary Examiner* — Douglas X Rodriguez
*Assistant Examiner* — Kendrick X Liu
(74) *Attorney, Agent, or Firm* — PEARL COHEN ZEDEK LATZER BARATZ LLP

(57) ABSTRACT

Pattern transfer printing (PTP) systems and methods are provided to improve the quality, accuracy and throughput of pattern transfer printing. PTP systems comprise a tape handling unit for handling a tape with pattern transfer sheets sections and for controllably delivering the pattern transfer sheets one-by-one for paste filling and consecutively for
(Continued)

pattern transfer, with the tape moving from an unwinder roll to a re-winding roll. PTP systems further comprise a paste filling unit which enables continuous paste filling using a supporting counter roll opposite to the paste filling head, a wafer handling and positioning unit controllably delivering wafers for the pattern transfer in a parallelized manner that increases throughput, a paste transfer unit with enhanced accuracy and efficiency due to exact monitoring and wafer alignment, as well as a print quality control unit.

33 Claims, 28 Drawing Sheets

(51) Int. Cl.
| | | |
|---|---|---|
| *B41J 2/475* | (2006.01) | |
| *B41M 5/025* | (2006.01) | |
| *H10F 71/00* | (2025.01) | |

(56) References Cited

U.S. PATENT DOCUMENTS

| | | | |
|---|---|---|---|
| 9,616,524 B2 | 4/2017 | Matusovsky et al. | |
| 10,973,129 B2 | 4/2021 | Landa et al. | |
| 11,910,537 B2 * | 2/2024 | Igra | H10F 71/00 |
| 2004/0110321 A1 | 6/2004 | Oda et al. | |
| 2009/0047597 A1 | 2/2009 | Felder et al. | |
| 2009/0074987 A1 | 3/2009 | Auyeung et al. | |
| 2011/0090564 A1 | 4/2011 | Utsuro | |
| 2011/0097550 A1 | 4/2011 | Matusovsky et al. | |
| 2012/0161081 A1 | 6/2012 | Kleine Jaeger et al. | |
| 2012/0219340 A1 * | 8/2012 | Rumsby | H01L 21/6715 |
| | | | 400/76 |
| 2013/0316492 A1 | 11/2013 | Ushifusa et al. | |
| 2017/0013724 A1 * | 1/2017 | Noy | H05K 3/1258 |
| 2017/0268100 A1 | 9/2017 | Hendriks et al. | |
| 2018/0015671 A1 | 1/2018 | Sandstrom et al. | |
| 2018/0243871 A1 | 8/2018 | Kokubo et al. | |
| 2018/0243971 A1 | 8/2018 | Kokubo et al. | |
| 2019/0174634 A1 * | 6/2019 | Landa | H10F 77/1698 |
| 2019/0213369 A1 * | 7/2019 | Ackley | H04N 1/00334 |
| 2020/0211729 A1 | 7/2020 | Chandrasekaran | |
| 2021/0136923 A1 | 5/2021 | Landa et al. | |
| 2021/0237184 A1 | 8/2021 | Zenou et al. | |
| 2022/0314598 A1 | 10/2022 | Gong et al. | |
| 2023/0019668 A1 | 1/2023 | Noy et al. | |
| 2023/0148357 A1 | 5/2023 | Igra et al. | |
| 2024/0290909 A1 * | 8/2024 | Kober | H01L 25/0753 |

FOREIGN PATENT DOCUMENTS

| | | | | |
|---|---|---|---|---|
| CN | 101927627 | | | 12/2010 |
| CN | 101934663 | | | 1/2011 |
| CN | 104647885 | | | 5/2013 |
| CN | 103129186 | | | 6/2013 |
| CN | 103189211 | | | 7/2013 |
| CN | 103358744 | | | 10/2013 |
| CN | 103481662 | | | 1/2014 |
| CN | 103722912 | A | * | 4/2014 |
| CN | 103730542 | | | 1/2016 |
| CN | 107532275 | | | 1/2018 |
| CN | 107554103 | A | * | 1/2018 |
| CN | 108656715 | | | 10/2018 |
| CN | 209756402 | U | | 12/2019 |
| CN | 111480207 | | | 7/2020 |
| CN | 111761840 | | | 10/2020 |
| CN | 216069167 | U | | 3/2022 |
| CN | 216139714 | U | | 3/2022 |
| CN | 217073727 | U | | 7/2022 |
| CN | 115489196 | | | 12/2022 |
| CN | 115610127 | | | 1/2023 |
| DE | 19746173 | | | 4/1999 |
| DE | 19746174 | | | 7/1999 |
| JP | H11149151 | A | * | 6/1999 |
| JP | 2006001094 | | | 1/2006 |
| JP | 2009149019 | | | 7/2009 |
| JP | 2016 171013 | | | 9/2016 |
| KR | 10-2012-0045067 | | | 5/2012 |
| KR | 2013-0133125 | | | 12/2013 |
| WO | WO 2005/040929 | | | 5/2005 |
| WO | WO 2007/096746 | | | 8/2007 |
| WO | WO 2010128244 | | | 11/2010 |
| WO | WO 2013/180370 | | | 12/2013 |
| WO | WO 2015/128857 | | | 9/2016 |
| WO | WO 2018/020479 | | | 2/2018 |
| WO | WO 2018/020481 | | | 2/2018 |
| WO | WO 2018/020483 | | | 2/2018 |
| WO | WO 2020/187453 | | | 9/2020 |

OTHER PUBLICATIONS

Luque and Hegedus (eds.) 2011, Handbook of photovoltaic science and engineering, pp. 276-277, https://kashanu.ac.ir/Files/Content/Handbook.pdf.

* cited by examiner

Onto wafer 90B

Unsupported wafer margin

Supported wafer margin

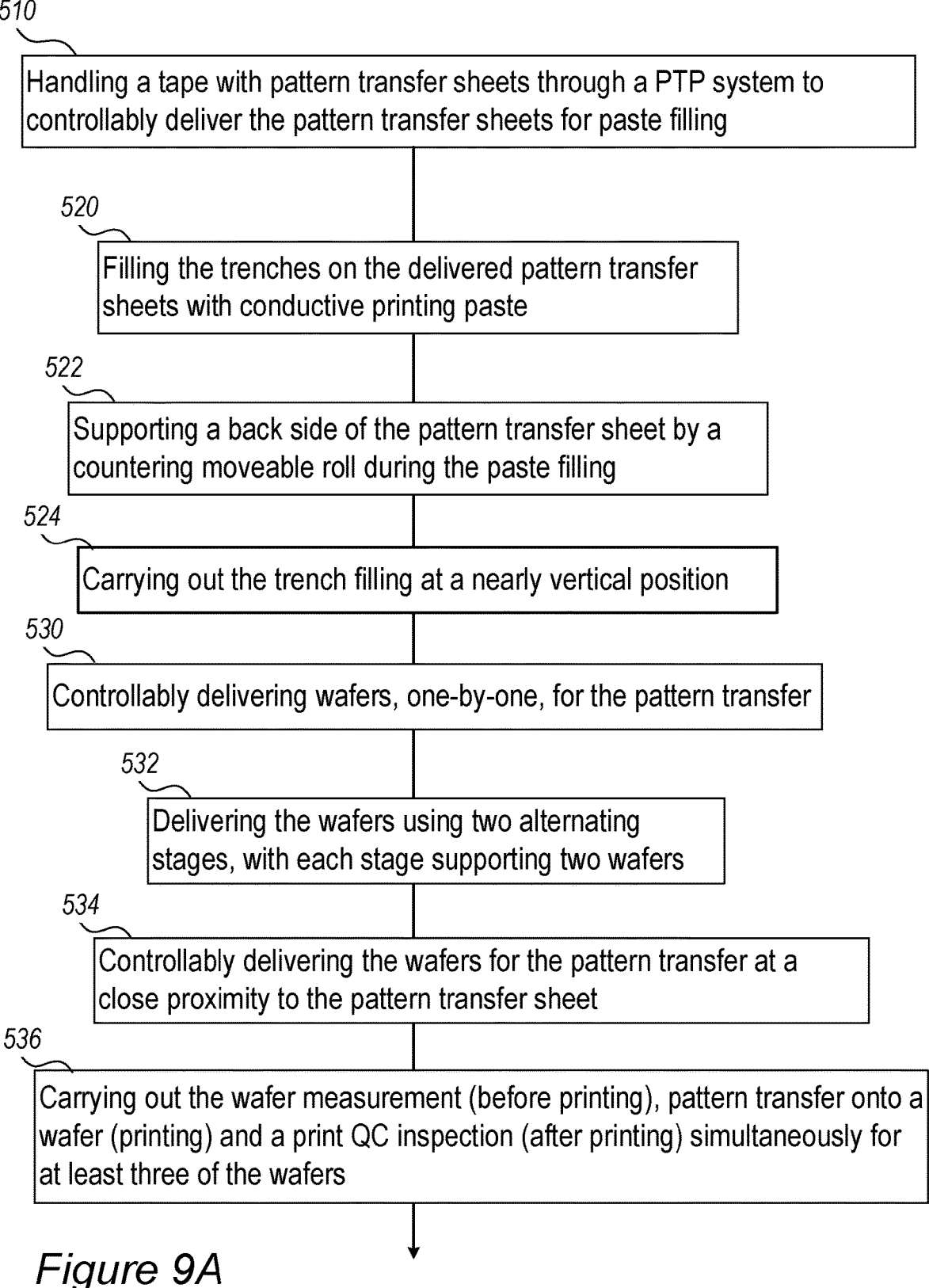

510

Handling a tape with pattern transfer sheets through a PTP system to controllably deliver the pattern transfer sheets for paste filling

520

Filling the trenches on the delivered pattern transfer sheets with conductive printing paste

522

Supporting a back side of the pattern transfer sheet by a countering moveable roll during the paste filling

524

Carrying out the trench filling at a nearly vertical position

530

Controllably delivering wafers, one-by-one, for the pattern transfer

532

Delivering the wafers using two alternating stages, with each stage supporting two wafers

534

Controllably delivering the wafers for the pattern transfer at a close proximity to the pattern transfer sheet

536

Carrying out the wafer measurement (before printing), pattern transfer onto a wafer (printing) and a print QC inspection (after printing) simultaneously for at least three of the wafers

*Figure 9A*

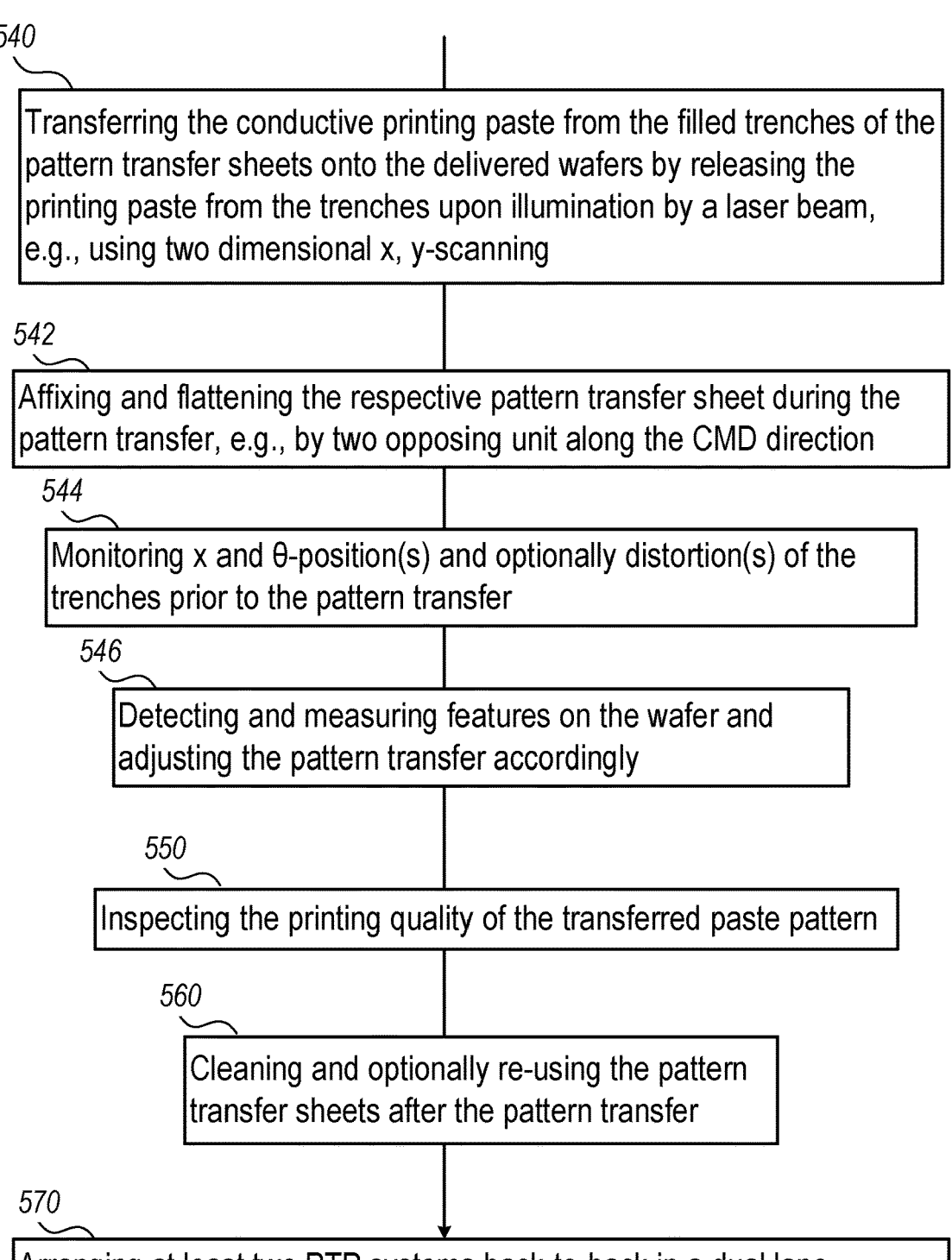

540

Transferring the conductive printing paste from the filled trenches of the pattern transfer sheets onto the delivered wafers by releasing the printing paste from the trenches upon illumination by a laser beam, e.g., using two dimensional x, y-scanning

542

Affixing and flattening the respective pattern transfer sheet during the pattern transfer, e.g., by two opposing unit along the CMD direction

544

Monitoring x and θ-position(s) and optionally distortion(s) of the trenches prior to the pattern transfer

546

Detecting and measuring features on the wafer and adjusting the pattern transfer accordingly

550

Inspecting the printing quality of the transferred paste pattern

560

Cleaning and optionally re-using the pattern transfer sheets after the pattern transfer

570

Arranging at least two PTP systems back-to-back in a dual lane production line, with parallel wafer delivery and with the tape accessible for maintenance

PATTERN TRANSFER PRINTING SYSTEMS AND METHODS

CROSS REFERENCE TO RELATED APPLICATIONS

This application is a Continuation-In-Part of U.S. application Ser. No. 17/583,440 Filed on Jan. 25, 2022, which claims priority from Chinese Patent Applications Nos. 02111321391.3 and 202122732445.7, both filed on Nov. 9, 2021, and Israel Patent Application No. 290194, filed on Jan. 19, 2022, which are incorporated herein by reference in their entirety.

BACKGROUND OF THE INVENTION

1. Technical Field

The present invention relates to the field of pattern transfer printing, and more particularly, to producing photovoltaic cells.

2. Discussion of Related Art

U.S. Patent Application Publication No. 2017/013724, which is incorporated herein by reference in its entirety, teaches an apparatus for generating a transfer pattern to be used in a transfer printing process. The pattern is generated in a substrate that could be a web substrate and that bears one or more trenches. A filler, e.g., high viscosity metal paste, to be transferred is made to fill the trenches within the web substrate. Upon completion of the trench of the substrate filled with filler, the filling head, which may include a scraper and a squeegee, is translated from the working zone in a synchronized movement, such that in course of the translation movement the filling head remains in full contact with the substrate. U.S. Patent Application Publication No. 2020/0211729, which is incorporated herein by reference in its entirety, teaches a conductive paste for use in a laser-induced pattern transfer printing process.

Lossen et al. (2015), Pattern Transfer Printing (PTP™) for c-Si solar cell metallization, $5^{th}$ Workshop on Metallization for Crystalline Silicon Solar Cells, Energy Procedia 67:156-162, which is incorporated herein by reference in its entirety, teaches pattern transfer printing (PTP™) as a non-contact printing technology for advanced front side metallization of c-Si PV solar cells, which is based on laser-induced deposition from a polymer substrate.

SUMMARY OF THE INVENTION

The following is a simplified summary providing an initial understanding of the invention. The summary does not necessarily identify key elements nor limit the scope of the invention, but merely serves as an introduction to the following description.

One aspect of the present invention provides a pattern transfer printing (PTP) system comprising: a tape handling unit configured to handle a tape comprising, as sections thereof, a plurality of pattern transfer sheets having respective patterns of trenches, and to controllably deliver the pattern transfer sheets for paste filling and consecutively for pattern transfer, a paste filling unit configured to fill the trenches on the delivered pattern transfer sheets with conductive printing paste, a wafer handling and positioning unit configured to controllably deliver a plurality of wafers for the pattern transfer at a close proximity to the pattern transfer sheet, a paste transfer unit configured to transfer the conductive printing paste from a respective one of the pattern transfer sheets onto a respective one of the delivered wafers, by releasing the printing paste from the trenches upon illumination by a laser beam, wherein the tape handling unit is configured to move the tape in a step-and-repeat manner from an unwinder roll to a re-winding roll and optionally to clean and dry the tape after printing during such movement.

Another aspect of the present invention provides a pattern transfer printing (PTP) system comprising a wafer handling system in which each of two x,z-stages working in parallel comprise two chucks for holding wafers, each chuck ensuring wafer movement in y, θ-axis thus enabling faster wafer handling and continuous wafers movement during pattern transfer. Multiple cameras imaging incoming wafers enable more accurate wafer alignment within the printing system thus more accurate alignment of printed conductive lines onto wafer pattern.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings:

FIG. 9A is a high-level flowchart illustrating PTP methods, according to some embodiments of the invention.

Figure 1A:
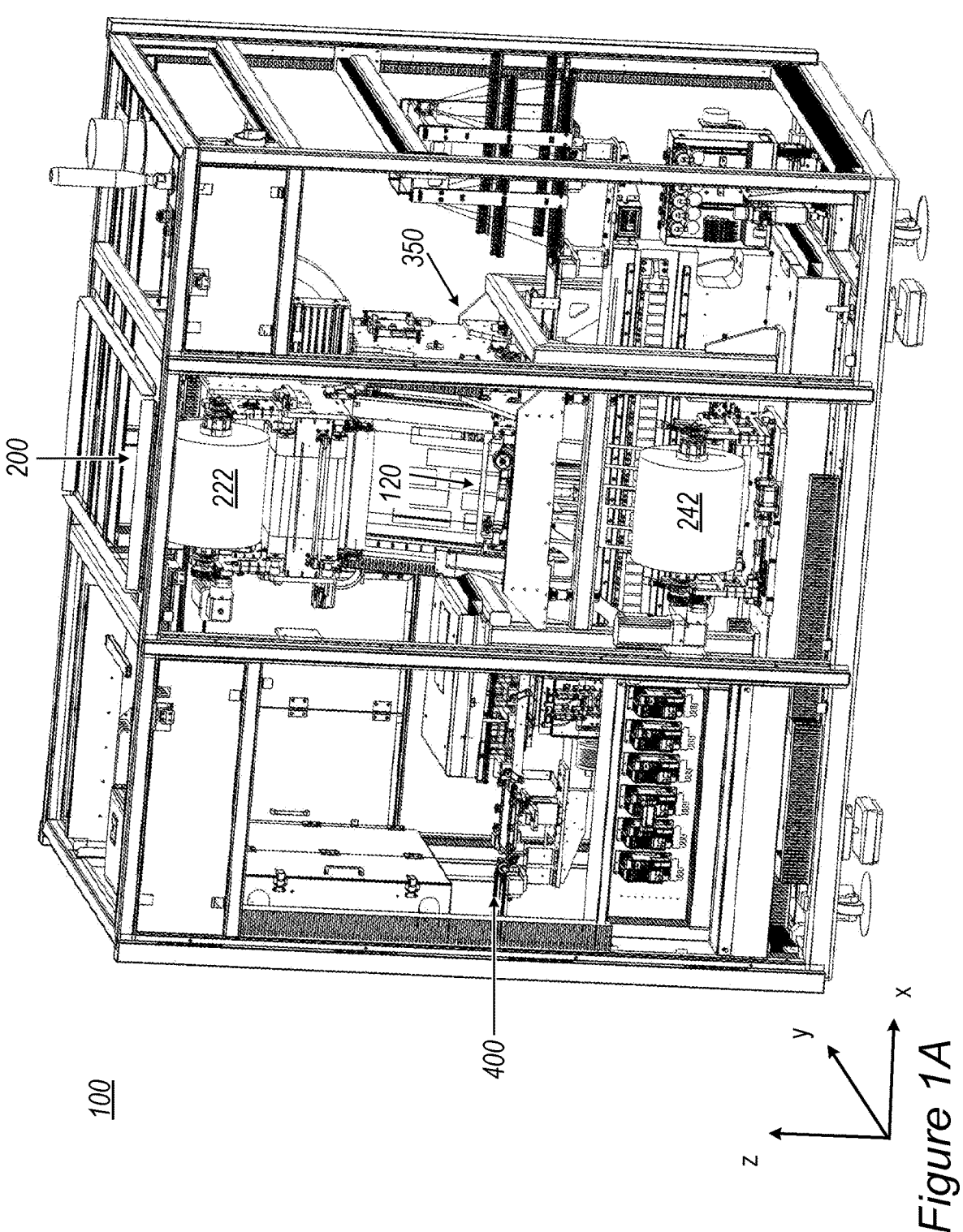
FIG. 1A is a high-level schematic illustration of a pattern transfer printing (PTP) system, according to some embodiments of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein are for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing", "deriving" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Embodiments of the present invention provide efficient and economical methods and mechanisms for pattern transfer printing and thereby provide improvements to the technological field of producing electrical contacts, and specifically of producing photovoltaic cells. Pattern transfer printing (PTP) systems and methods are provided to improve the quality, accuracy and throughput of pattern transfer printing. PTP systems comprise a tape handling unit for handling a tape with pattern transfer sheets and for controllably delivering the pattern transfer sheets one-by-one for paste filling and consecutively for pattern transfer, with the tape moving from an unwinder roll to a re-winding roll. PTP systems further comprise a paste filling unit which enables continuous paste filling using a supporting counter roll opposite to the paste filling head, a wafer handling and positioning unit controllably delivering wafers for the pattern transfer in a parallelized manner that increases throughput, a paste transfer unit with enhanced accuracy and efficiency due to exact monitoring and wafer alignment, as well as a print quality control. The PTP system may be configured to be used in a dual lane configuration with two parallel wafer flows so that the tape and the paste replacement and maintenance in each system are accessible from their front sides. Disclosed PTP systems have been constructed and optimized to specific requirements by configuring their modules according to various specifications.

Figures 1B, 1C:
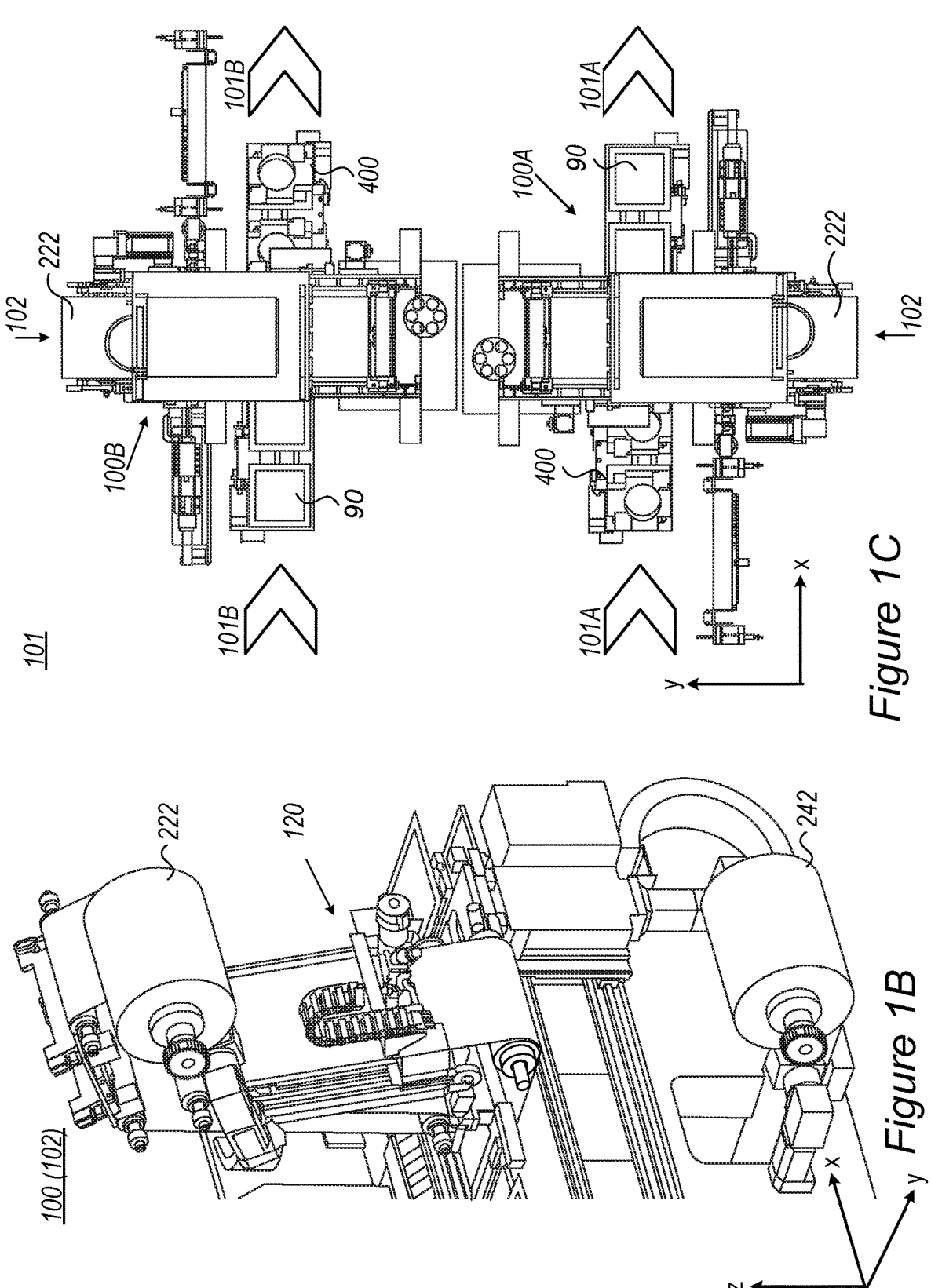
FIGS. 1B and 1C are high-level schematic illustrations of maintenance options and arrangements of PTP systems in a dual-lane production line, according to some embodiments of the invention.
Figure 2A:
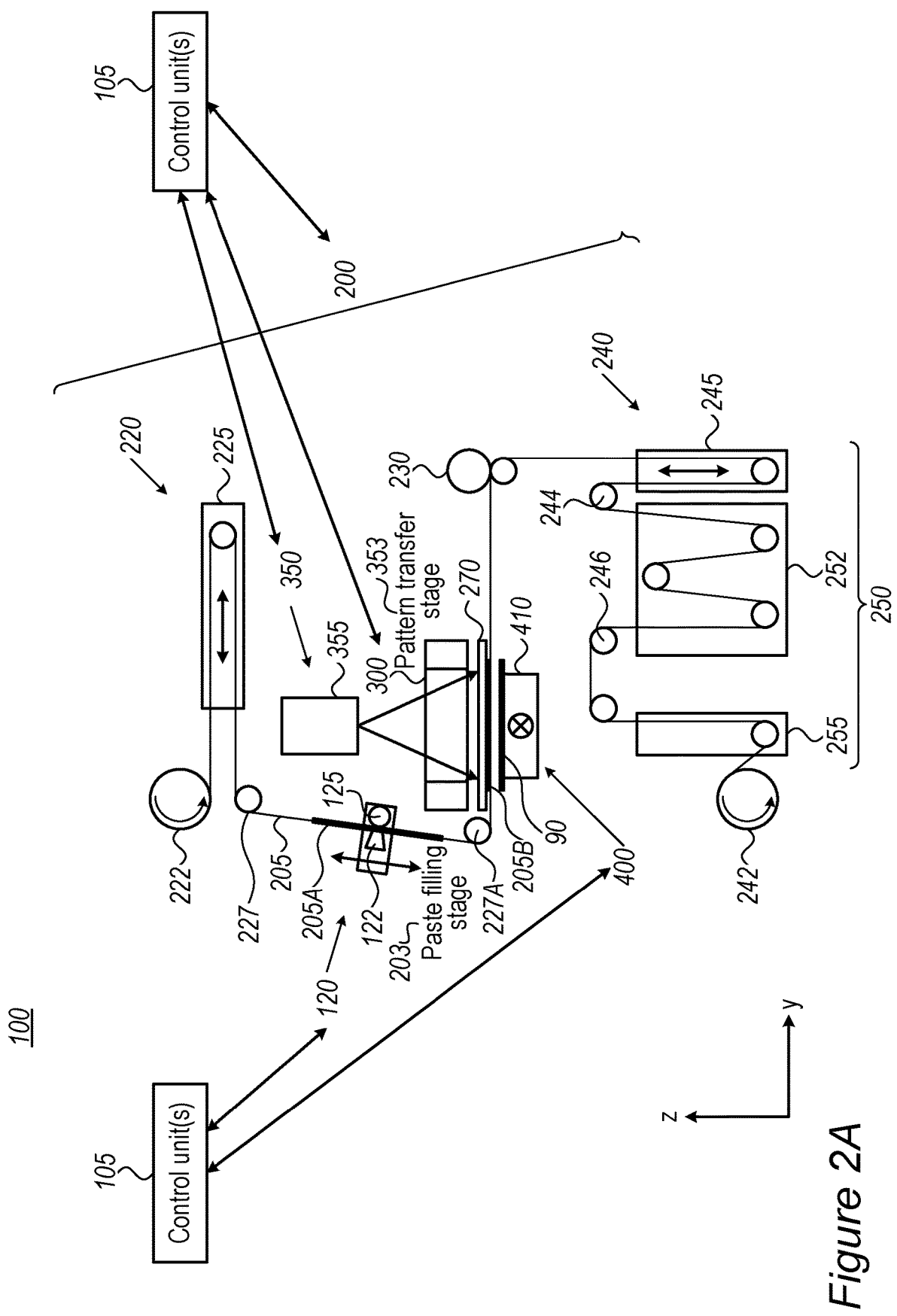
FIGS. 2A and 2B are high-level schematic side view and front view illustrations, respectively, of units and elements in PTP systems, according to some embodiments of the invention.
Figure 2B:
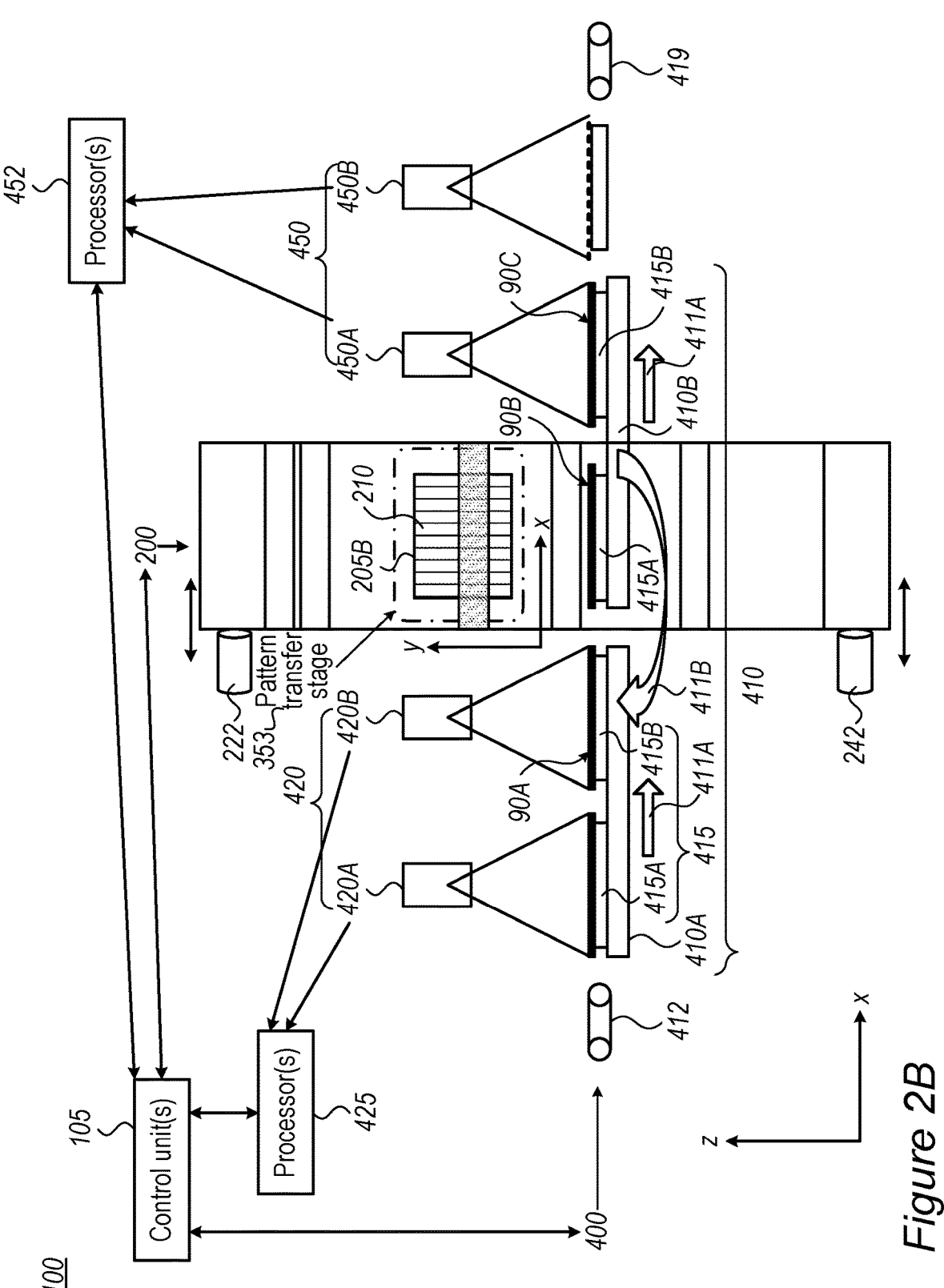

FIG. 1A is a high-level schematic illustration of a pattern transfer printing (PTP) system 100, according to some embodiments of the invention. FIGS. 1B and 1C are high-level schematic illustrations of maintenance options and arrangements of PTP systems 100 in a dual-lane production line 101, according to some embodiments of the invention. FIG. 1A is a schematic perspective front view of PTP system 100, FIG. 1B is a schematic perspective view of a front side 102 of PTP system 100, made accessible for easy maintenance, and FIG. 1C is a schematic top view of PTP systems 100 arranged in a dual-lane production line 101. FIGS. 2A and 2B are high-level schematic side view and front view illustrations, respectively, of units and elements in PTP systems 100, according to some embodiments of the invention. The highly schematic side view illustration of FIG. 2A provides a non-limiting example for the arrangement of elements in tape handling unit 200 with respect to paste filling unit 120 (carrying out a paste filling stage 203) and paste transfer unit 350 (carrying out a pattern transfer stage 353, see, e.g., in FIGS. 2A and 2B), while the highly schematic front view illustration of FIG. 2B provides a non-limiting example for the arrangement of elements in wafer handling and positioning unit 400 and with respect to tape handling unit 200. Units and elements illustrated in FIGS. 2A and 2B are described briefly below, with more details of non-limiting embodiments providing in the consecutive figures. One or more control units 105 (see, e.g., in FIGS. 2A and 2B), may be configured to monitor and/or control the units of PTP system 100, possibly via various processors, and coordinate the operation of PTP system 100.

PTP system 100 is configured to apply patterns of conductive material onto wafers by non-contact printing. PTP system 100 comprises a tape handling unit 200 configured to handle a tape 205 (see, e.g., FIG. 2A) comprising, as sections thereof, a plurality of pattern transfer sheets 205A, 205B (see, e.g., FIG. 2A) having respective patterns of trenches, and to controllably deliver pattern transfer sheets for paste filling 205A and consecutively for pattern transfer 205B, respectively. Tape handling unit 200 is configured to move tape 205 in a step-and-repeat manner (sheet by sheet) from an unwinder roll 222 to a re-winding roll 242. PTP system 100 further comprises a paste filling unit 120 configured to fill the trenches on delivered pattern transfer sheets 205A with conductive printing paste. Tape handling unit 200 may be further configured to deliver the pattern transfer sheets one-by-one for the paste filling (denoted sheets 205A) and/or for the pattern transfer (denoted sheets 205B) with continuous monitoring of the tension and the Machine Direction (MD, along the tape movement) and Cross Machine Direction (CMD, perpendicularly to MD) positions of tape 205. PTP system 100 further comprises a wafer handling and positioning unit 400 configured to controllably deliver a plurality of wafers 90 (see, e.g., FIG. 2B) for the pattern transfer, at a close proximity (e.g., in a range of between 0.1 mm and 0.5 mm) to the pattern transfer sheet. The PTP system 100 further comprises a paste transfer unit 350 configured to transfer the conductive printing paste from respective pattern transfer sheet 205B onto respective delivered wafer 90B, by releasing the printing paste from the trenches upon illumination by a laser beam 80 (illustrated, e.g., in FIG. 3A).

The units of PTP system 100 are mounted on a rigid frame in a compact manner, to minimize the system's footprint. As a general design feature, tape handling is carried out along a vertical direction (denoted "z") and along one horizontal direction (denoted "y", termed machine direction, MD), while wafer handling is carried out along a perpendicular direction thereto, e.g., in another horizontal direction (denoted "x", termed cross machine direction, CMD).

Tape handling unit 200 may be configured to deliver pattern transfer sheets one-by-one for the paste filling (e.g., pattern transfer sheet 205A)—at a paste filling process stage 203, by help of a moving paste filling head 122—and/or for the pattern transfer (e.g., pattern transfer sheet 205B)—in a paste pattern transfer unit carrying out paste transfer process stage 353, by help of a movable scanner 355 (e.g., moveable along the x and y axes and optionally tiltable at an angle θ, or possibly an optical head that scans along the y axis, is moveable along the x axis and optionally tiltable at an angle θ), see, e.g., FIG. 2A. Details concerning tape 205 and pattern transfer sheets thereupon are provided below. It is noted that in FIG. 2B pattern transfer sheet 205A is illustrated schematically at the plane of the drawing as it is located in the paste filling unit 120 almost vertically. For example, paste filling unit 120 and pattern transfer sheet 205B plane may be set at an angle deviating 0-30° from the vertical x-z plane.

In embodiments, one or more top dancer 225 and bottom dancer 245 (see, e.g., FIG. 2A) may be configured to buffer the step-and-repeat movement of tape 205 from unwinder roll 222 and to re-winding roll 242, respectively, as pattern transfer sheet 205A is being filled with paste and/or as paste from pattern transfer sheet 205B is being transferred, so as to ensure that these are carried out with the respective pattern transfer sheet in static positions. Top dancer(s) 225 and/or bottom dancer(s) 245 may be configured to maintain the tension in tape 205 moving through at least a part of PTP system 100.

It is noted that in PTP system 100, paste filling unit 120 is positioned almost vertically (along the z axis) to ensure a short travelling distance of pattern transfer sheet 205A from paste filling to pattern transfer sheet 205B at paste transfer unit 350 thus enabling to minimize changes of the filled paste condition (e.g., due to drying before printing). For example, the near-vertical position may be configured to enable a smaller movement distance for the pattern transfer sheets from state 205A to state 205B, and thereby optionally to locate the laser scanner just behind the vertical filling unit, closer to roll 227A positioned between 205A and 205B, illustrated schematically in FIG. 2A. The near-vertical position of paste filling unit 120 is advantageous with respect to prior art horizontal position of paste filling units, as it reduces the distance between the paste filling position (205A) and the paste transfer position (205B) of the pattern transfer sheet 205.

As illustrated schematically in FIG. 1B, front side 102 of PTP system 100 may be configured to have unwinder roll 222 and re-winding roll 242 easily accessible for replacement and maintenance requirements, as well as have paste filling unit 120 easily accessible for paste filling and maintenance requirements—from same front side 102. Moreover, as illustrated schematically in FIG. 1C, PTP systems 100 may be arranged back-to-back, in dual-lane production line 101, with each of front sides 102 of PTP systems 100A, 100B easily accessible for maintenance. Dual-lane production line 101 may be configured to include two lanes 101A, 101B, each with one or more (serially arranged) PTP systems 100A, 100B, which operate on two (or more) paths of wafers 90 (e.g., independent paths for higher throughput), using a relatively small footprint.

PTP system 100 may further comprise a tape re-use unit 250 (see, e.g., FIG. 2A) configured to clean pattern transfer sheets after the pattern transfer to provide reusable pattern transfer sheets. For example, tape re-use unit 250 may comprise a tape cleaning unit 252 in which tape 205 may be cleaned mechanically, e.g., using scraper(s), ultrasound, and/or other means, and/or chemically using cleaning solutions; and a tape drying unit 255, with idle rolls 244, 246 positioned as needed to maintain safe tape movements. Tape 205 may be moved by one or more tape drive motor(s) 230 (illustrated schematically), and further supported by one or more rolls 227 along the way of tape 205 through PTP system 100. A non-limiting example for tape handling unit 200 is illustrated with more details in FIGS. 3A-3E. A non-limiting example for tape re-use unit 250 is illustrated with more details in FIG. 4.

Paste filling unit 120 (see, e.g., FIG. 2A) may comprise moveable paste filling head 122 and a countering moveable roll 125 configured to support a back side of pattern transfer sheet 205A during the paste filling. A non-limiting example for paste filling unit 120 is illustrated with more details in FIGS. 5A-5E.

In certain embodiments, wafer handling and positioning unit 400 may comprise at least one stage 410 enabling movement in x and z axes (termed in the following—the x,z-stage), with each stage 410 comprising at least one holder (e.g., chuck) 415, and with each holder supporting wafer 90 and enabling wafer movement in y and θ axes (θ axis relates to rotation of a wafer with respect to the x-y plane). In certain embodiments, two x,z-stages 410 of wafer handling and positioning unit 400 may be configured to operate in parallel with respect to each other. Each stage 410 may comprise two holders 415 for holding wafers 90, each holder 415 ensuring wafer movement in y, θ-axis thus enabling faster wafer handling and continuous wafers movement during pattern transfer. Multiple cameras imaging incoming wafers enable more accurate wafer alignment within the printing system thus more accurate alignment of printed conductive lines onto wafer pattern.

Wafer handling and positioning unit 400 (see, e.g., FIG. 2B) may comprise two stages 410A, 410B, with each stage 410 supporting two wafers 90, e.g., via wafer holders 415A, 415B (e.g., vacuum chucks). Each stage 410 may support at least one wafer holder (chuck) 415, e.g., two or three holders (chucks) 415. As a non-limiting example, two holders (chucks) 415A, 415B for each of two stages 410A, 410B are illustrated. Stages 410 may be configured to enable movement along the x and z axes, while each holder (chuck) 415 may be configured to support wafer 90 and enable additional wafer movement at least along the y and θ axes, as explained below.

Wafer handling and positioning unit 400 may be configured to alternate two stages 410A, 410B during operation to enable parallel operation on wafers 90 by different units of PTP system 100. For example, the position of wafer 90A may be measured by a wafer alignment unit 420 while wafer 90B received transferred paste by paste transfer unit 350 and wafer 90C is inspected by a print quality control unit 450, as disclosed herein. During the alteration of stages 410, two wafers 90 may be processed by respective units, increasing the overall throughput of PTP system 100. For example, wafer handling and positioning unit 400 may be configured to provide simultaneous (i) wafer measurement of two wafers 90A (first and second wafers, mounted on holders (chucks) 415A and 415B on stage 410A, respectively), (ii) pattern transfer to a third wafer 90B (mounted on holder (chuck) 415A on stage 410B) and (iii) print quality control of a fourth wafer 90C (mounted on holder (chuck) 415B on stage 410B). Then, wafer handling and positioning unit 400 may be configured to move stages 410A, 410B according to arrows 411A, so that the wafers are move to the consecutive operations (e.g., wafer 90A is moved from wafer measurement to pattern transfer, wafer 90B is moved from pattern transfer to print quality control and wafer 90C is moved out of the system, while a new wafer is moved to wafer measurement). Following the linear stage movements along CMD, stages 410A, 410B may be switched (arrow 411B), so that wafer 90 are further processed, and the movements repeat cyclically, as illustrated schematically in FIG. 6C).

Wafer handling and positioning unit 400 may further comprise mechanical elements such as an input wafer conveyor 412 for supplying wafers 90 and mounting them on wafer holders 415 of respective stage 410 and output wafer conveyor 419 for receiving printed wafers 90 from wafer holders 415 of respective stage 410. Non-limiting examples for wafer handling and positioning units 400 and schematic descriptions of their operation is illustrated with more details in FIGS. 6A-6E.

Figure 6A:
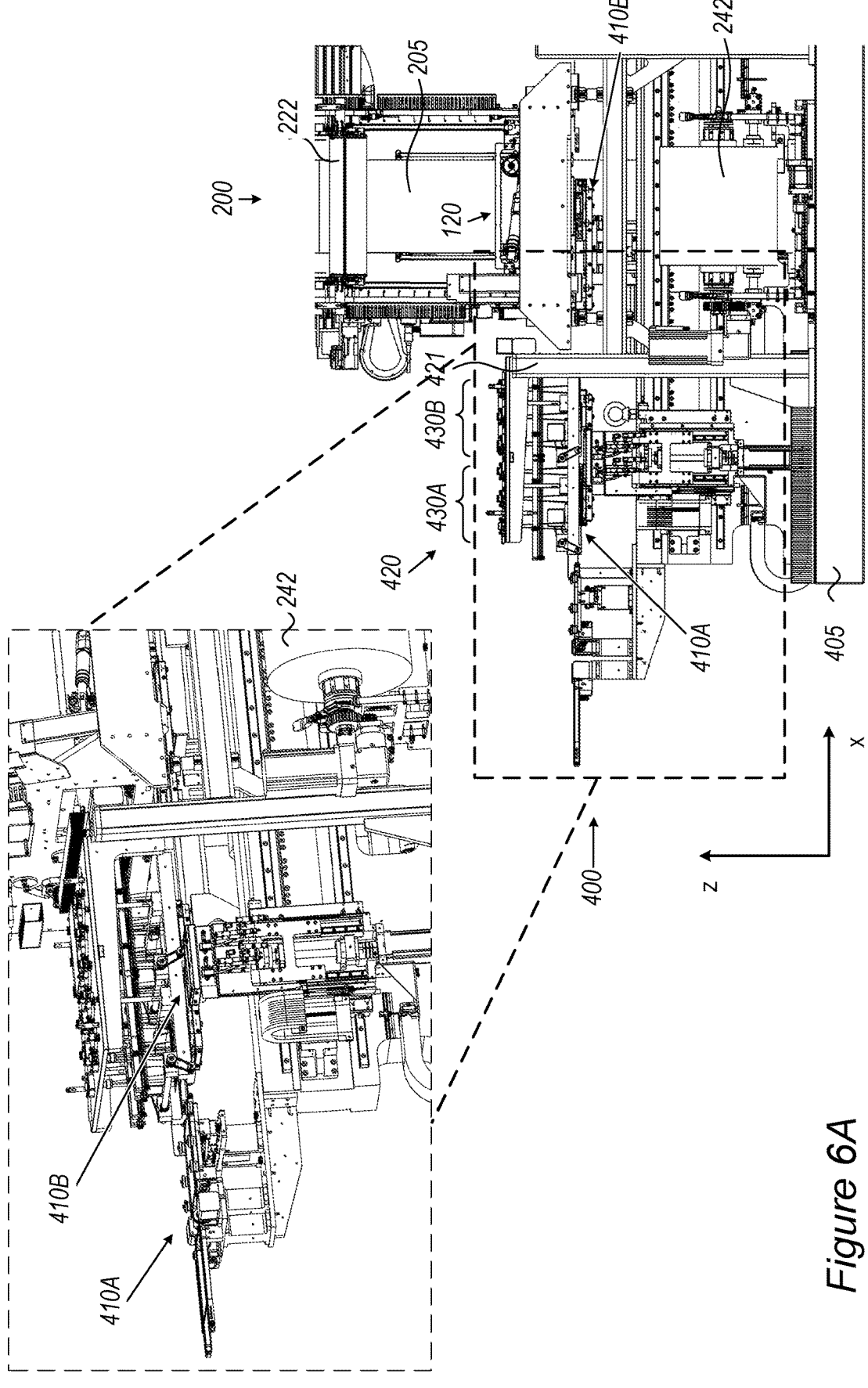
FIGS. 6A-6F are high-level schematic illustrations of wafer handling and positioning units and of their operation, according to some embodiments of the invention.
Figure 6B:
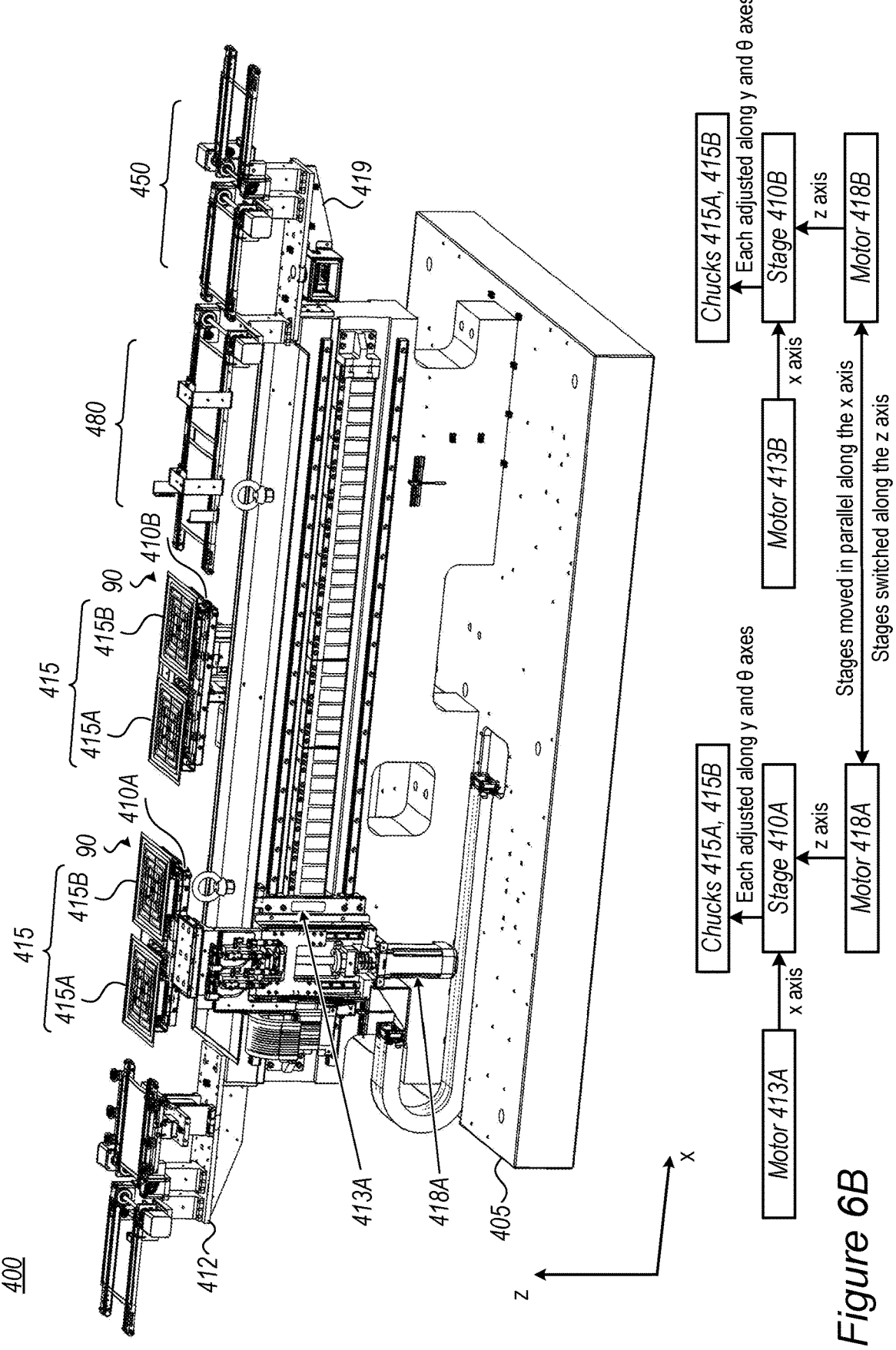
Figure 6C:
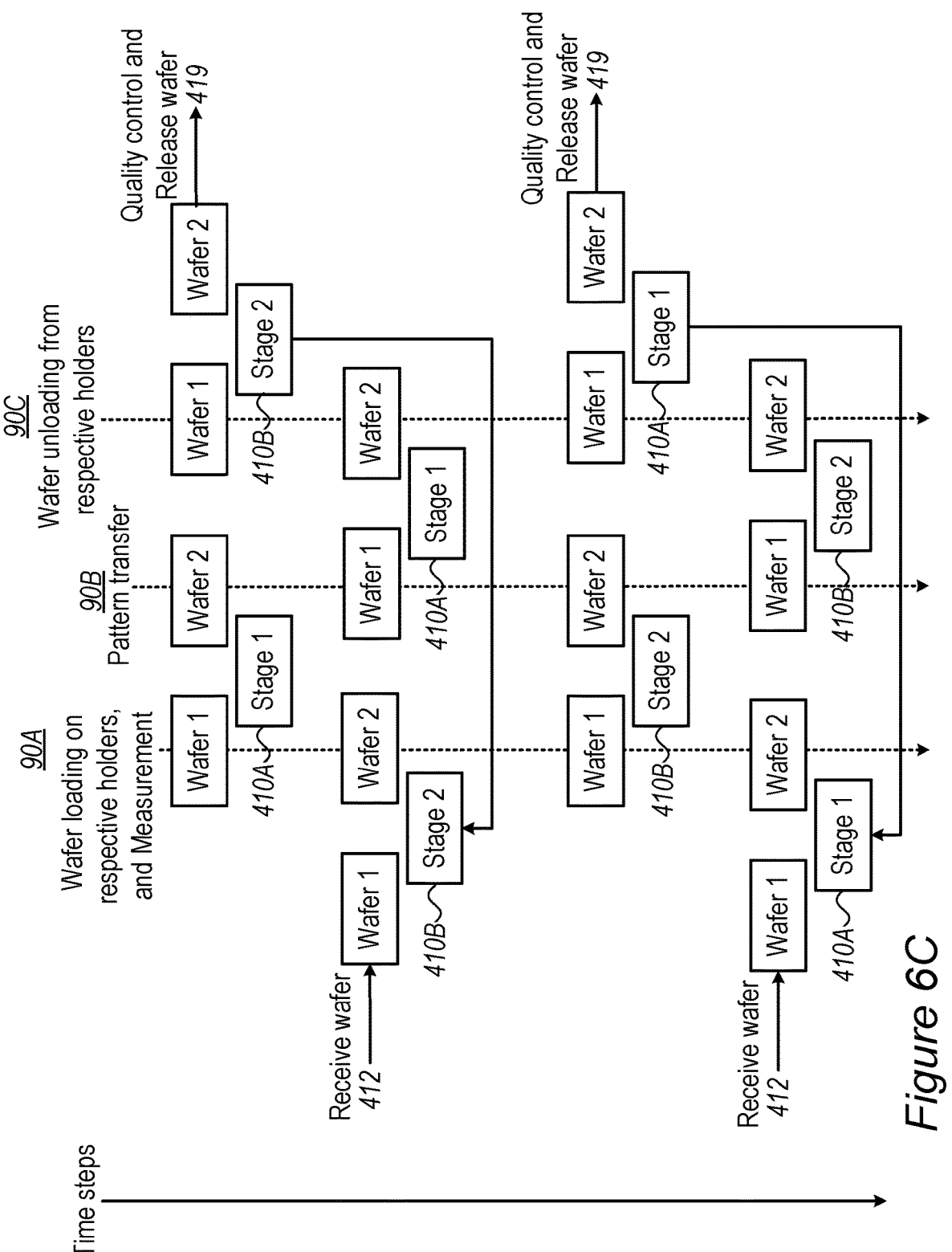
Figure 6D:
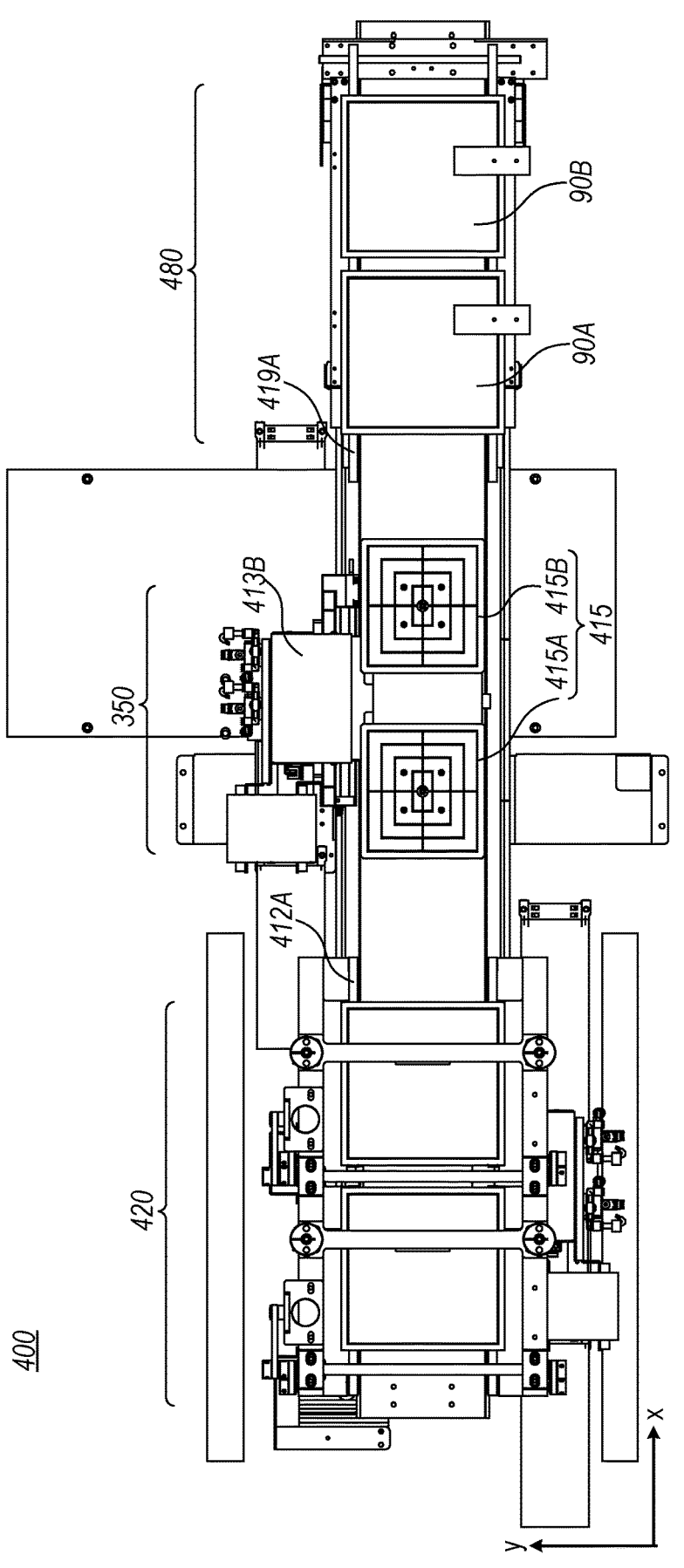
Figure 6E:
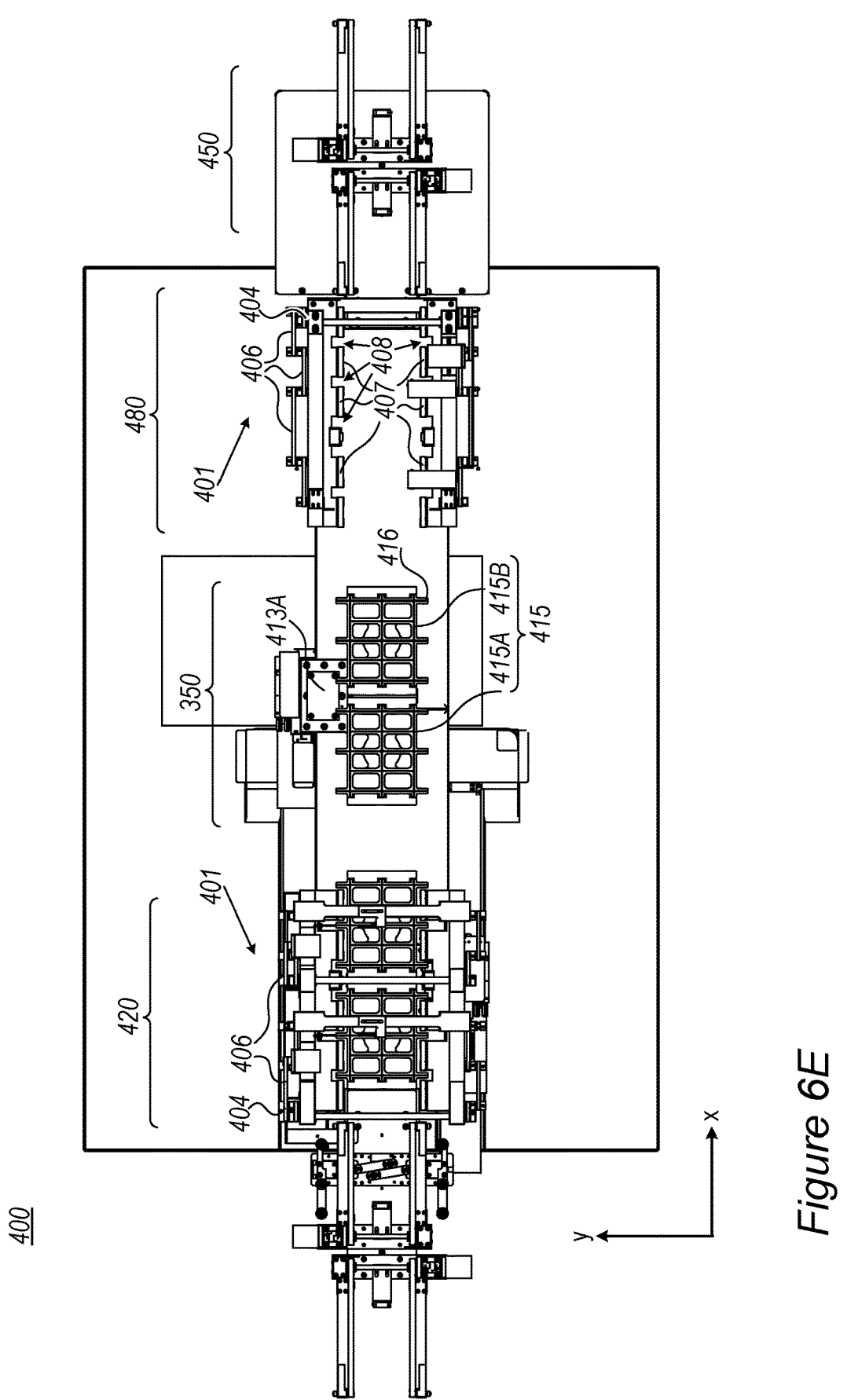
Figures 6F, 6G, 6H, 6I:
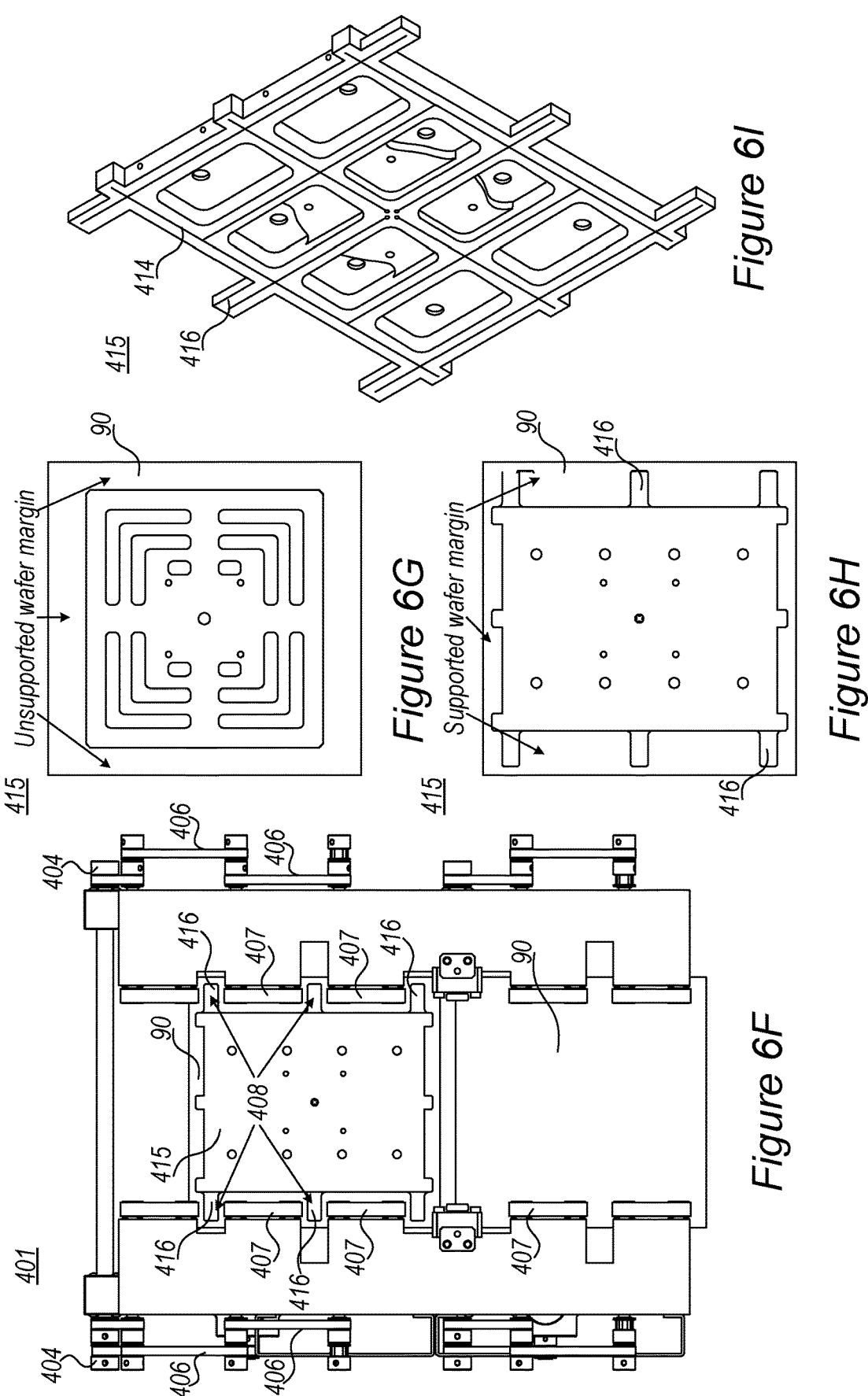
FIGS. 6G-6I are high-level schematic illustrations of wafer holders, according to some embodiments of the invention.
Figure 6J:
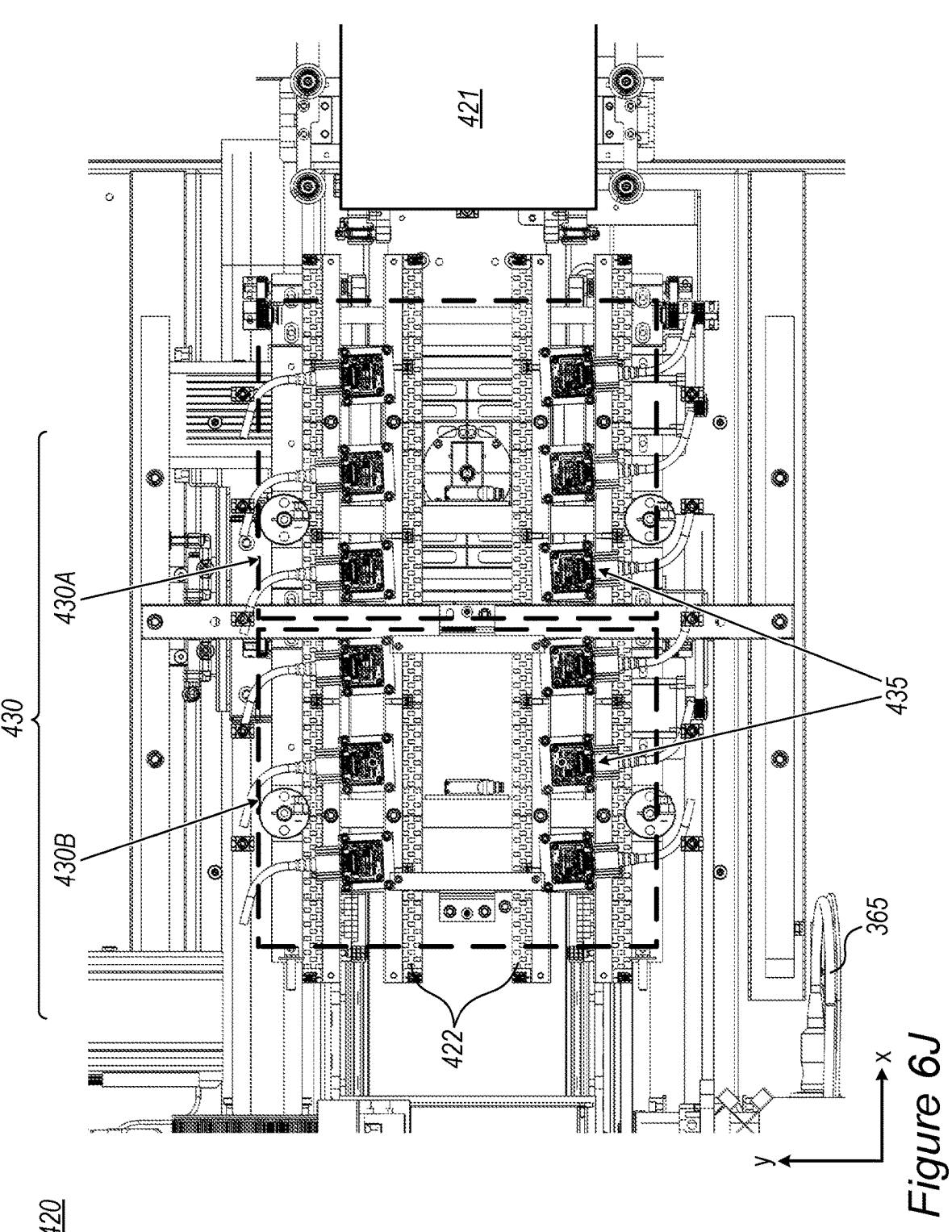
FIGS. 6J and 6K are high-level schematic illustrations of wafer measurement units, according to some embodiments of the invention.
Figure 6K:
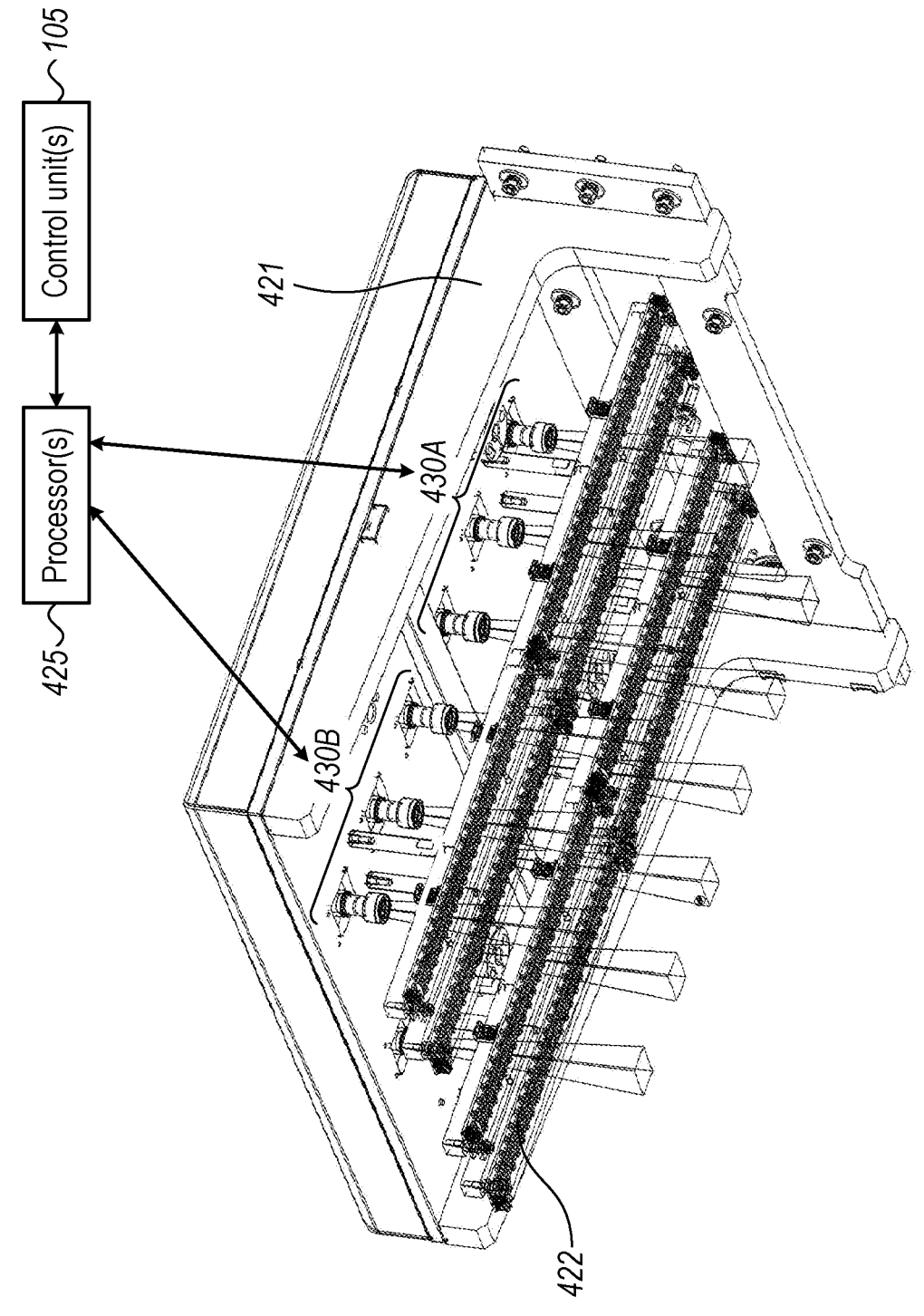

Wafer alignment unit(s) 420 (e.g., 420A and 420B, see FIG. 2B) may be configured to detect and measure features on wafers and to adjust the wafer position to the pattern transfer accordingly—is illustrated with more details in a non-limiting example in FIGS. 6J and 6K.

In certain embodiments, wafer handling and positioning unit 400 may comprise more than two stages 410, accompanied with multiplication of any of wafer alignment unit 420, paste transfer unit 350 and/or print quality control unit 450—to further increase the throughput of PTP system 100.

PTP system 100 may further comprise a tape stretching unit 270 (see, e.g., FIGS. 2A and 7A) configured to affix and flatten respective pattern transfer sheet 205B during the paste pattern transfer from pattern transfer sheet 205B to wafer 90B. PTP system 100 may further comprise a trench alignment monitoring unit 300 configured to monitor a position (e.g., in x, y and theta (tilt) directions) and a distortion of the trenches prior to the pattern transfer. A non-limiting example for tape stretching unit 270 and trench alignment monitoring unit 300 is illustrated with more details in FIGS. 7A-7C.

Paste transfer unit 350 (e.g., a laser scanner) may comprise a laser scanner (scanning head) 355 (e.g., movable along CMD, e.g., by a linear stage, a ball-screw stage, etc.) configured to control the illumination of pattern transfer sheets 205B by the laser beam for depositing the paste from the patterned trenches of pattern transfer sheets 205B.

PTP system 100 may further comprise a print quality control unit(s) 450 (e.g., 450A and 450B, see FIG. 2B) configured to control a print quality of the pattern transfer, in particular to detect tiny defects such as openings or gaps within the printed fingers or other defects in the pattern that was transferred onto the wafer. For example, print quality control unit(s) 450 may be based on imaging cameras, which transfer the acquired images of inspected wafers to processor(s) 452 for image processing. A non-limiting example for a print quality control unit 450 is illustrated with more details in FIG. 8.

Figure 3A:
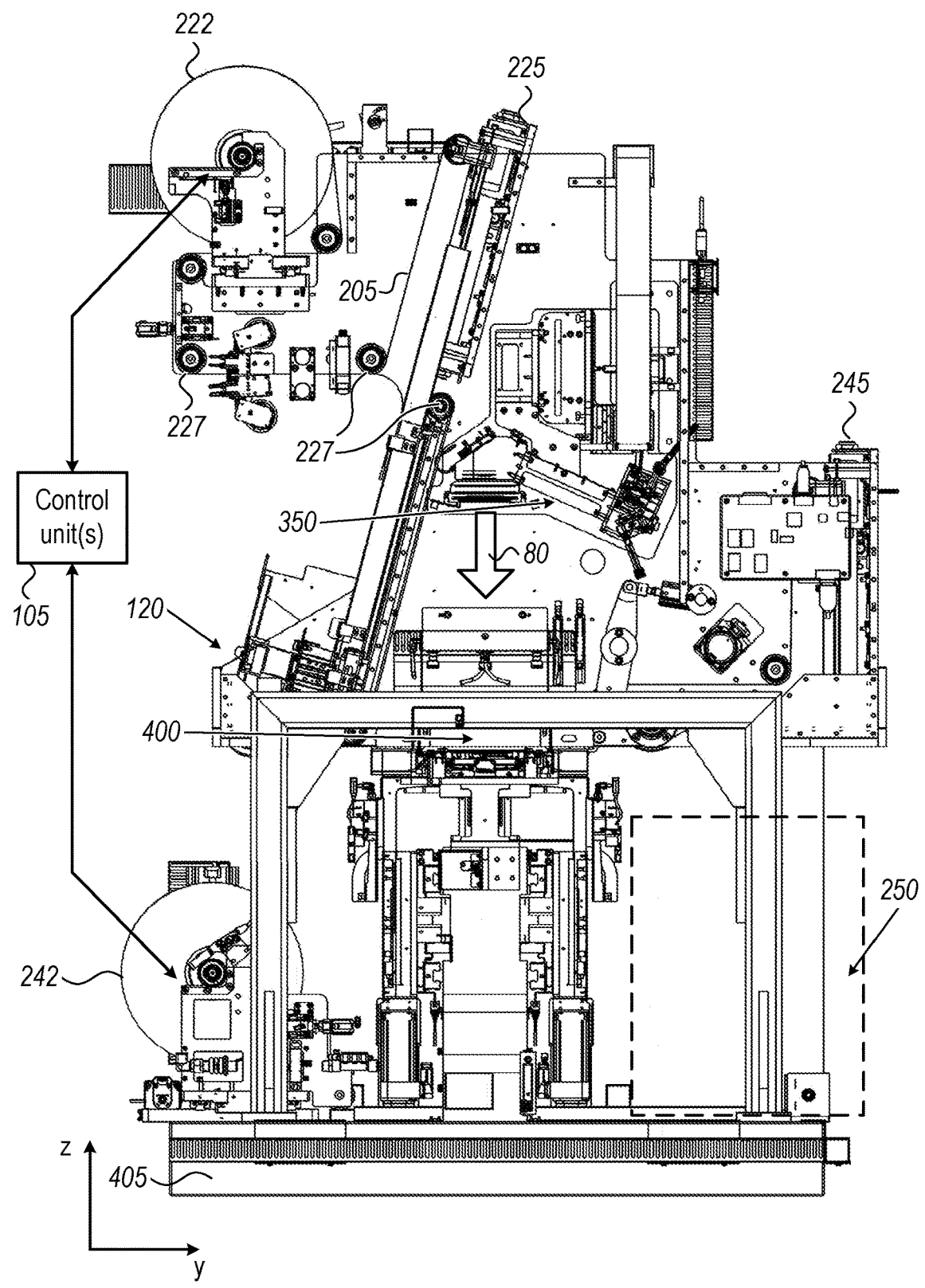
FIG. 3A is a high-level schematic side view illustration of a tape handling unit, according to some embodiments of the invention.

FIG. 3A is a high-level schematic side view illustration of tape handling unit 200, according to some embodiments of the invention. Tape handling unit 200 may be configured to move tape 205, while delivering pattern transfer sheets 205A one-by-one for the paste filling (at paste filling unit 120, see, e.g., FIG. 2A) and/or for the pattern transfer (at pattern transfer unit 350) by continuously controlling the tape tensions and accurate position of the sheets in both MD and CMD coordinates. FIGS. 3B-3E are high-level schematic illustrations of tape 205 with pattern transfer sheets 205B (see, e.g., FIG. 2A) and of paste pattern transfer unit 350, according to some embodiments of the invention.

The CMD positions of unwinder roll 222 and re-winding roll 242 may be continuously controlled and if needed corrected by help of one or more control unit(s) 105, e.g., by controlling driving motor(s) thereof. Top dancer(s) 225 and bottom dancer(s) 245 may be configured to support fast stepwise movements of pattern transfer sheets 205A, 205B (as segments of tape 205) to their respective positions for paste filling and pattern transfer. Idle rolls 227 (only some of which indicated) may be configured to direct tape movement through tape handling unit 200.

Tape handling unit 200 may be configured to enable fast and accurate provision and changing of the tape segments (pattern transfer sheets) used to print the wafers. Tape handling unit 200 may be further configured to have a compact design with a minimal footprint, and be set within a stable and rigid frame or chassis for supporting its operation and also for enabling easy maintenance. Tape re-use unit 250 may be set within the frame and in the path of tape 205 and enable reusing tape 205—making the overall process more efficient and economical.

FIGS. 3B-3E are high-level schematic illustrations of tape 205 with pattern transfer sheets 205B and of pattern transfer unit 350, according to some embodiments of the invention, which are disclosed in more details in Chinese Patent Applications Nos. 202111034191X and 2021221306455, incorporated herein by reference in their entirety.

Figure 3B:
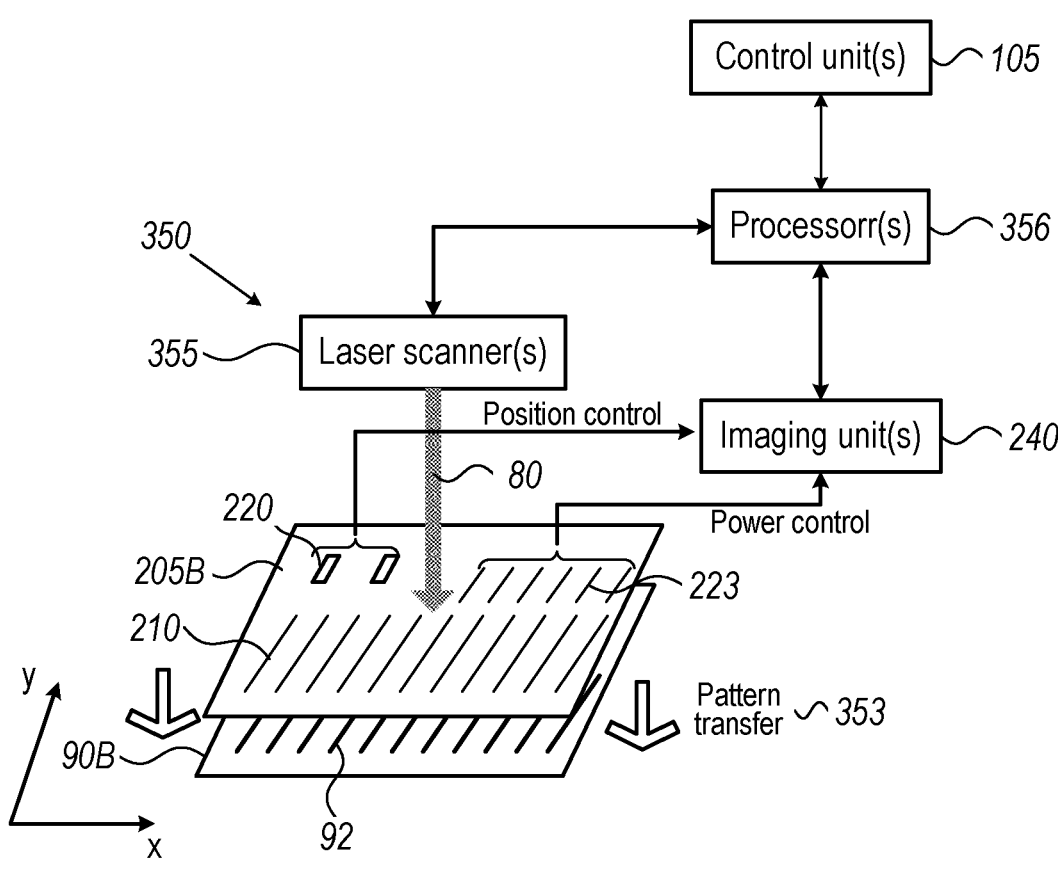
FIGS. 3B-3E are high-level schematic illustrations of tapes with pattern transfer sheets and of the pattern transfer stage, according to some embodiments of the invention.

Highly schematic FIG. 3B illustrates transfer of patterned paste from the pattern transfer sheet 205B to substrate (e.g., wafer) 90B using laser illumination by laser scanner(s) 355. Pattern transfer sheets 205B comprises a plurality of trenches 210 arranged in a specified pattern and configured to receive printing paste and release the printing paste from trenches 210 upon illumination by laser beam 80 onto a receiving substrate such as wafer 90B. FIGS. 3B and 3E schematically illustrate the filling of trenches 110 on an empty pattern transfer sheet on tape 205 with paste to yield filled pattern transfer sheet 205A, which is then moved further in PTP system 100 to have the paste released from trenches 210 of pattern transfer sheet 205B onto wafer 90B. It is noted that while the tape is denoted generally by the numeral 205, sections of tape 205 that are designed as used as pattern transfer sheets are denoted by numeral 205A when they are in paste filling stage 203 and are denoted by numeral 205B when they are in paste pattern transfer stage 353 (illustrated schematically in FIG. 3B by an arrow).

Pattern transfer sheets may further comprise at least one trace mark 220 that is located outside the specified pattern of trenches 210 and is configured to receive the printing paste. Trace mark(s) 220 is aligned with respect to respective trench(es) 210 and is wider than a width of laser beam 80. Upon illumination by laser beam 80, only a part of the paste in trace mark(s) 220 is released (off pattern transfer sheet 205B), because the width of trace mark(s) 220 is larger than the width of laser beam 80—yielding a gap that may be used to detect the actual position of the laser beam relative to the position of the corresponding trench.

Pattern transfer sheet may further comprise a plurality of working window marks 223 that are located outside the specified pattern of trenches 210 and are configured to receive the printing paste. Working window marks 223 are set at specified offsets with respect to specified trenches 210 of the specified pattern, with different working window marks 223 being set at different offsets. Working window marks 223 may be used to monitor the power of laser beam 80 needed for releasing paste from all the trenches.

In certain embodiments, pattern transfer sheet may comprise both trace mark(s) 220 and working window marks 223, which may be configured to enable unambiguous detection by image processing, e.g., by a trench alignment monitoring unit 300.

Pattern transfer sheet may further comprise a plurality of alignment marks (not shown) that are located outside the specified pattern of trenches 210, aligned with respective trenches 210, configured to receive the printing paste and used to provide initial laser scanner alignment with respect to the specified pattern of trenches 210.

A trench alignment monitoring unit 300 may be configured to monitor the pattern transfer process optically, e.g., monitoring the transfer of the printing paste by emptying of trenches 210 and of marks 220, 223 onto the substrate, as explained herein. One or more processor(s) 356 or controller(s), in communication with control unit(s) 105, may be in communication with laser scanner(s) 355 (in paste transfer unit 350) and imaging unit(s) 300 and be configured to adjust optical parameters of laser illumination by modifying the settings of power and position of laser scanner(s) 355 according to image analysis of images taken by imaging unit(s) 300. These adjustments and modifications improve the quality and accuracy of pattern transfer stage 353. For example, processor(s) 356 or controller(s) may be configured to calculate an alignment of laser beam 80 according to traces on pattern transfer sheet (after the paste is released therefrom), e.g., detect misalignment of laser scanner 355 upon detection of asymmetric trace(s) as disclosed in Chinese patent application Nos. 202111034191X and 2021221306455, incorporated herein by reference in their entirety. Processor(s) 356 or controller(s) may be further configured to calculate an effective working window of laser illumination 80 using remaining working window marks 223 on pattern transfer sheet (after the paste is released therefrom), and adjust laser power of the laser scanner 355 accordingly. Additional non-limiting details for PTP systems 100 are provided, e.g., in U.S. Pat. No. 9,616,524.

Disclosed PTP systems 100 and tape 205 may be used to print fine lines 92 of thick metallic paste to produce electronic circuits, e.g., creating conductive lines or pads or other features on laminates for PCBs or other printed electronic boards, or on silicon wafers, e.g., for photovoltaic (PV) cells. Other applications may comprise creating conductive features in the manufacturing processes of mobile phones antennas, decorative and functional automotive glasses, semiconductor integrated circuits (IC), semiconductor IC packaging connections, printed circuit boards (PCB), PCB components assembly, optical biological, chemical and environment sensors and detectors, radio frequency identification (RFID) antennas, organic light-emitting diode (OLED) displays (passive or active matrix), OLED illuminations sheets, printed batteries and other applications. For example, in non-limiting solar applications, the metallic paste may comprise metal powder(s), optional glass frits and modifier(s), volatile solvent(s) and non-volatile polymer(s) and/or or resin(s). A non-limiting example for the paste includes SOL9651B™ from Heraeus™.

Figure 3C:
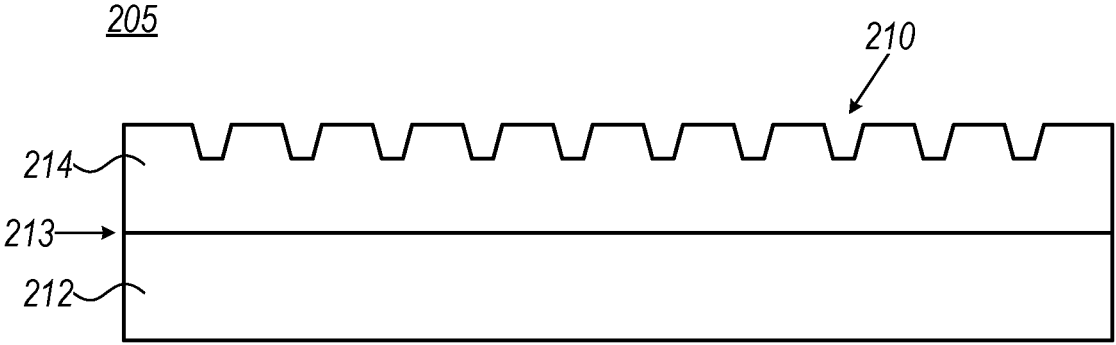

FIG. 3C is a high-level schematic cross section illustration of tape (pattern transfer sheet) 205, according to some embodiments of the invention. In certain embodiments, tape 205 may be transparent to laser illumination and comprise at least a top polymer layer 214 comprising trenches 210 and marks 220, 223 (illustrated schematically in FIG. 3B) which formed by press molding, pneumatic molding or laser molding thereon. In the illustrated non-limiting example, trenches 210 are illustrated as being trapezoid in cross section.

Tape 205 may comprise at least one polymer layer, which may be selected from at least one of: polyethylene, polypropylene, polyethylene terephthalate, polybutylene terephthalate, polyethylene naphthalate, fully aromatic polyester, other copolymer polyester, polymethyl methacrylate, other copolymer acrylate, polycarbonate, polyamide, polysulfone, polyether sulfone, polyether ketone, polyamideimide, polyether imide, aromatic polyimide, alicyclic polyimide, fluorinated polyimide, cellulose acetate, cellulose nitrate, aromatic polyamide, polyvinyl chloride, polyphenol, polyarylate, polyphenylene sulfide, polyphenylene oxide, or polystyrene.

It is noted that while schematic FIG. 3C shows periodical trenches 210, marks 220 and/or 223 (illustrated schematically in FIG. 3B) may comprise trenches, recesses and/or indentations that are embossed in a similar manner into top polymer layer 214, and may have similar or different profiles. For example, trenches 210, trace marks 220 and/or working window marks 223, and alignment marks may have various profiles (cross section shapes), such as trapezoid, rounded, square, rectangular and triangular profiles. In various embodiments, the pattern of trenches 210 on tape 205 may comprise continuous trenches 210 and/or arrays of separated dents. It is noted that the term "trenches" is not to be construed as limiting the shape of trenches 210 to linear elements, but is understood in a broad sense to include any shape of trenches 210.

Tape 205 may comprise a top polymer layer 214 and a bottom polymer layer 212, the bottom polymer layer 212 having a melting temperature that is higher than an embossing temperature of the top polymer layer 214. In some embodiments, top polymer layer 214 may be made of semi-crystalline polymer and have a melting temperature, e.g., below 150° C., below 130° C., below 110° C. or have intermediate values. In some embodiments, top polymer layer 214 may be made of amorphous polymer and have a glass temperature below 160° C., e.g., below 140° C., below 120° C., below 100° C. or have intermediate values. Bottom polymer layer 212 may have a higher melting temperature than the melting temperature or the glass temperature of top polymer layer 214. For example, bottom polymer layer 212 may have a melting temperature above 150° C., above 160° C. (e.g., bi-axially-oriented polypropylene), above 170° C., and up to 400° C. (e.g., certain polyimides), or have intermediate values.

In certain embodiments, top and bottom polymer layers 214, 212 (respectively) may be between 10 μm and 100 μm thick, e.g., between 15 μm and 80 μm thick, between 20 μm and 60 μm thick, between 25 μm and 45 μm thick, or have other intermediate values—with bottom polymer layer 212 being preferably at least as thick as top polymer layer 214. The polymer layers may be attached by an adhesive layer 213 that is thinner than 10 μm (e.g., thinner than 8 μm, thinner than 6 μm, thinner than 4 μm, thinner than 2 μm or have intermediate values) and is likewise transparent to the laser illumination. For example, in certain embodiments, top polymer layer 214 may be thicker than the depth of trenches 210 by several μm, e.g., by 5 μm, by 3-7 μm, by 1-9 μm, or by up to 10 μm. For example, trenches 210 may be 20 μm deep, top polymer layer 214 may be 20-30 μm thick and bottom polymer layer 212 may range in thickness between 25 μm and 45 μm (it is noted that thicker bottom polymer layer provide better mechanical performances). It is noted that the term "trenches" is not to be construed as limiting the shape of trenches 210 to linear elements, but is understood in a broad sense to include any shape of trenches 210.

The temperature and thickness of top and bottom polymer layers (214, 212 respectively) may be designed so that top polymer layer 214 has good molding, ductility and certain mechanical strength, while bottom polymer layer 212 has good mechanical strength. Both top and bottom polymer layers (214, 212 respectively) may be designed to have good bonding properties.

Figure 3D:
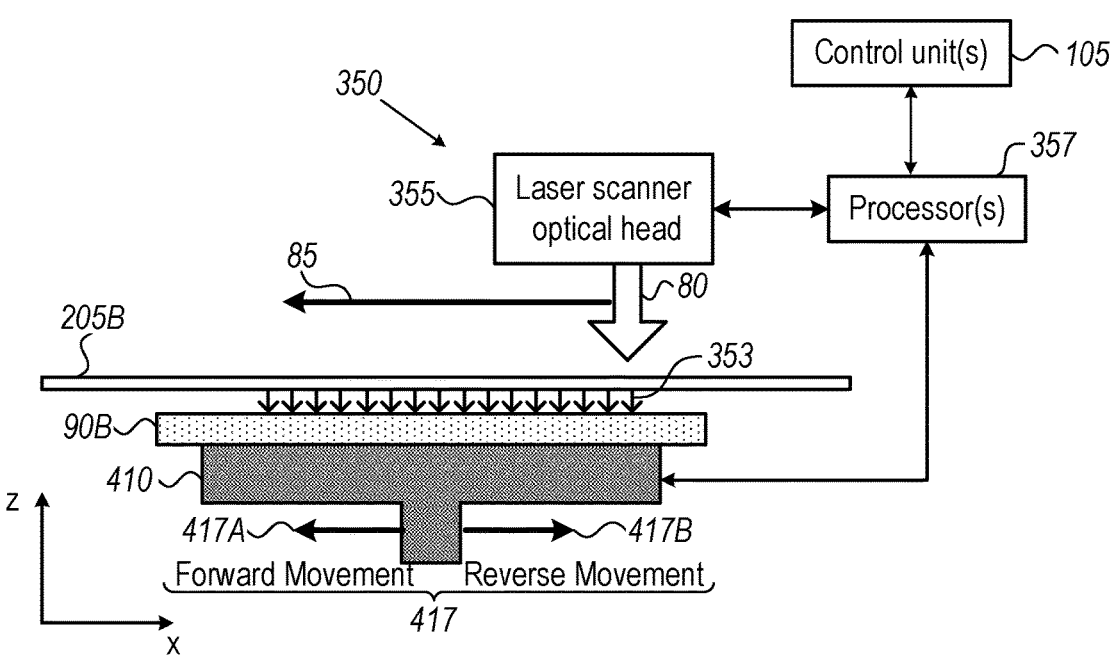
Figure 3E:
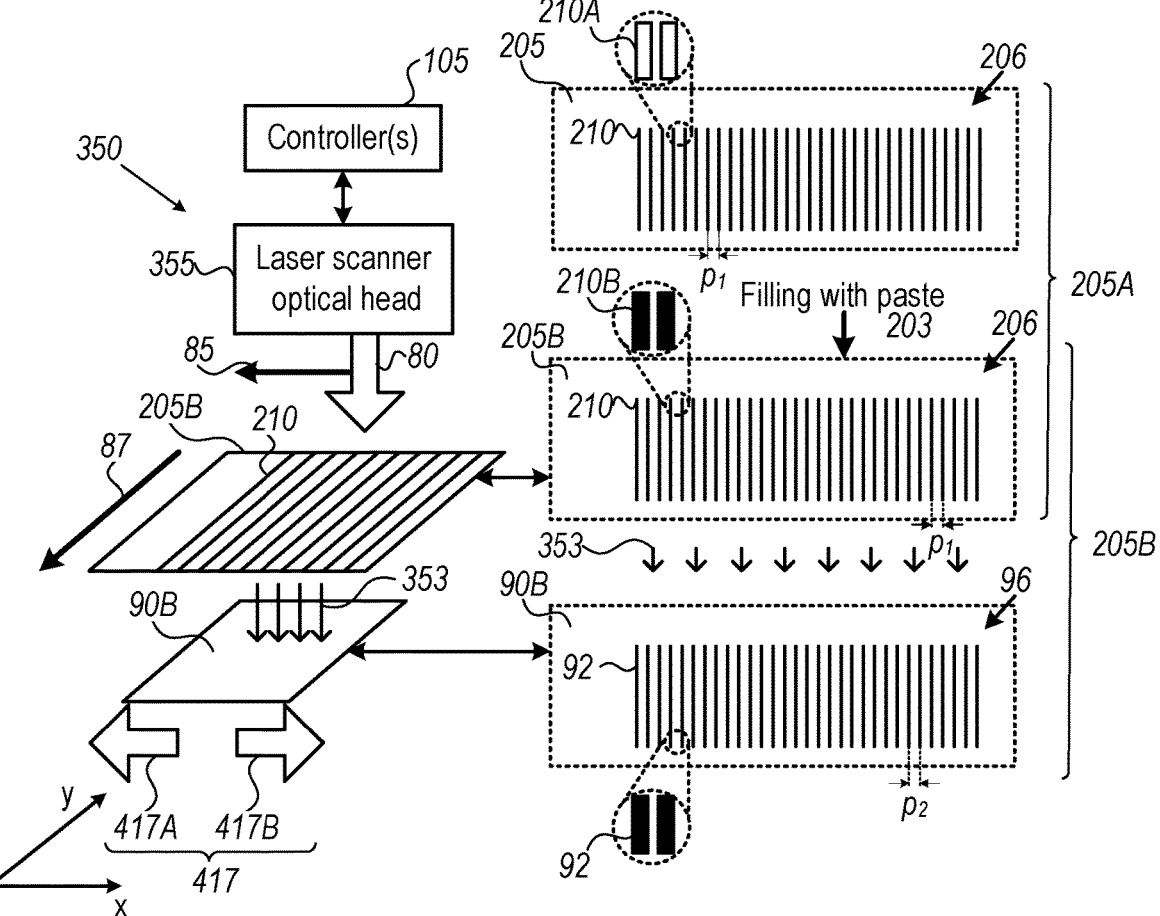

FIGS. 3D and 3E are high-level schematic illustrations of dynamic PTP system 100, according to some embodiments of the invention. Dynamic PTP system 100 comprises at least one laser scanner optical head(s) 355 configured to illuminate with laser beam(s) 80 pattern transfer sheet 205B with trenches 210 arranged in a first pattern 206 and holding printing paste in filled trenches 92, which is then released onto wafers 90 upon the illumination by laser beam 80 from laser scanner optical head(s) 355 configured to have a fast-scanning axis along machine direction 87 (y axis, MD) and may be moved along cross machine direction 85 (x axis, CMD). The releasing of the paste from the trenches implements pattern transfer stage 353, which is indicated schematically in FIGS. 3D and 3E by arrows.

Dynamic PTP system 100 may comprises moveable stages 410 with wafer holders 415 affixing wafers 90 (e.g., by help of vacuum clamping) to moveable stage 410 during the releasing of printing paste 92 from pattern transfer sheet 205B. Moveable stage 410 may comprise any type of stage or wafer holder that can affix and move wafers 90. Moveable stage 410 may be moved by any type of actuator, e.g., by linear or step motors.

Dynamic PTP system 100 may further comprises controller(s) and/or processor(s) 357, possibly associated with control unit(s) 105, and configured to control laser scanner optical head 355 to direct laser beam 80 along trenches 210 (along machine direction 87—MD), and at a cross machine direction 85 (CMD, scanning direction) across trenches 210. Processor(s) 357 may further be configured to move moveable stage 410 (the movements are denoted schematically by numeral 417) to yield a second pattern 96 of deposited paste on wafer 90, which is different from first pattern 206 of trenches 210 on pattern transfer sheet 205B. Advantageously, in contrast to current practice which is limited to transferring the same pattern (e.g., of lines) from pattern transfer sheet 205B to wafer 90, various embodiments of dynamic PTP system 100 enable to deposit the transferred metal paste onto wafer 90 at patterns (second pattern 96) which are different from first pattern 206 of trenches 210 on pattern transfer sheet 205B.

As illustrated schematically in FIG. 3E, wafer 90B may comprise a pattern of substantially parallel linear locations arranged with a certain receiving pitch $p_2$, for receiving the paste release from trenches 210 of pattern transfer sheet 205B, in a close proximity (e.g., in a range of between 0.1 mm and 0.5 mm) to pattern transfer sheet 205B in such a way that the first trench on pattern transfer sheet 205B is located exactly opposite to the first linear location on wafer 90B. Scanning the paste-filled trench pattern 206 on pattern transfer sheet 205B by laser beam 80 sequentially from the first trench to the last trench results in the deposition of the paste onto the specified locations on wafer 90B to yield deposited paste in a specified pattern 96. As processor(s) 357 and/or control unit 105 move wafer 90B during the scanning (movements indicated schematically by numeral 417), the paste is deposited at a different pitch ($p_2 \neq p_1$), depending on the direction and speed of motion.

It is noted that scanning along x-axis may be carried out in forward and/or backward directions, and respective movements 417 of wafer 90 may be adjusted accordingly. In the present disclosure cross machine direction 85 is illustrated in one direction, as a non-limiting example.

For example, first pattern 206 of trenches 210 on pattern transfer sheet 205B may have a first pitch ("$p_1$") and second pattern 96 of deposited paste on wafer 90 may have a second pitch ("$p_2$"), that may be smaller or larger than first pitch ("$p_1$"), e.g., $p_1 > p_2$ or $p_1 < p_2$. It is noted that second pattern 96 may differ from first pattern 206 over the whole extent of wafer 90 or over a part of the extent of wafer 90. In some examples, the difference of pattern may comprise $p_1 > p_2$ in some area(s) of wafer 90 while $p_1 < p_2$ in other area(s) of wafer 90.

In certain embodiments, with first pitch $p_1$ being larger than second pitch $p_2$ ($p_1 > p_2$), processor 357 may be configured to move moveable stage 410 along scanning direction 85 (CMD, denoted 417A) at a forward speed set to convert first pitch $p_1$ to second pitch $p_2$. For example, with forward speed denoted as $v_F$ and the time between deposition of consecutive lines denoted as t, $p_2 = p_1 - v_F \cdot t$. Alternatively or complementarily, denoting the scanner speed across trenches 210 as $v_S = p_1/t$, the approximate relation between the pitches is $p_2 = p_1 \cdot (v_S - v_F)/v_S$.

In certain embodiments, with first pitch $p_1$ being smaller than second pitch $p_2$ ($p_1 < p_2$), processor 357 may be configured to move moveable stage 410 against (in a contrary direction to) scanning direction 85 (CMD, denoted 417B) at a backward speed set to convert first pitch $p_1$ to second pitch $p_2$. For example, with backward speed denoted as $v_B$ and the time between deposition of consecutive lines denoted as t, $p_2 = p_1 + v_B \cdot t$. Alternatively or complementarily, denoting the scanner speed across trenches 210 as $v_S = p_1/t$, the approximate relation between the pitches is $p_2 = p_1 \cdot (v_S + v_B)/v_S$.

Figure 4:
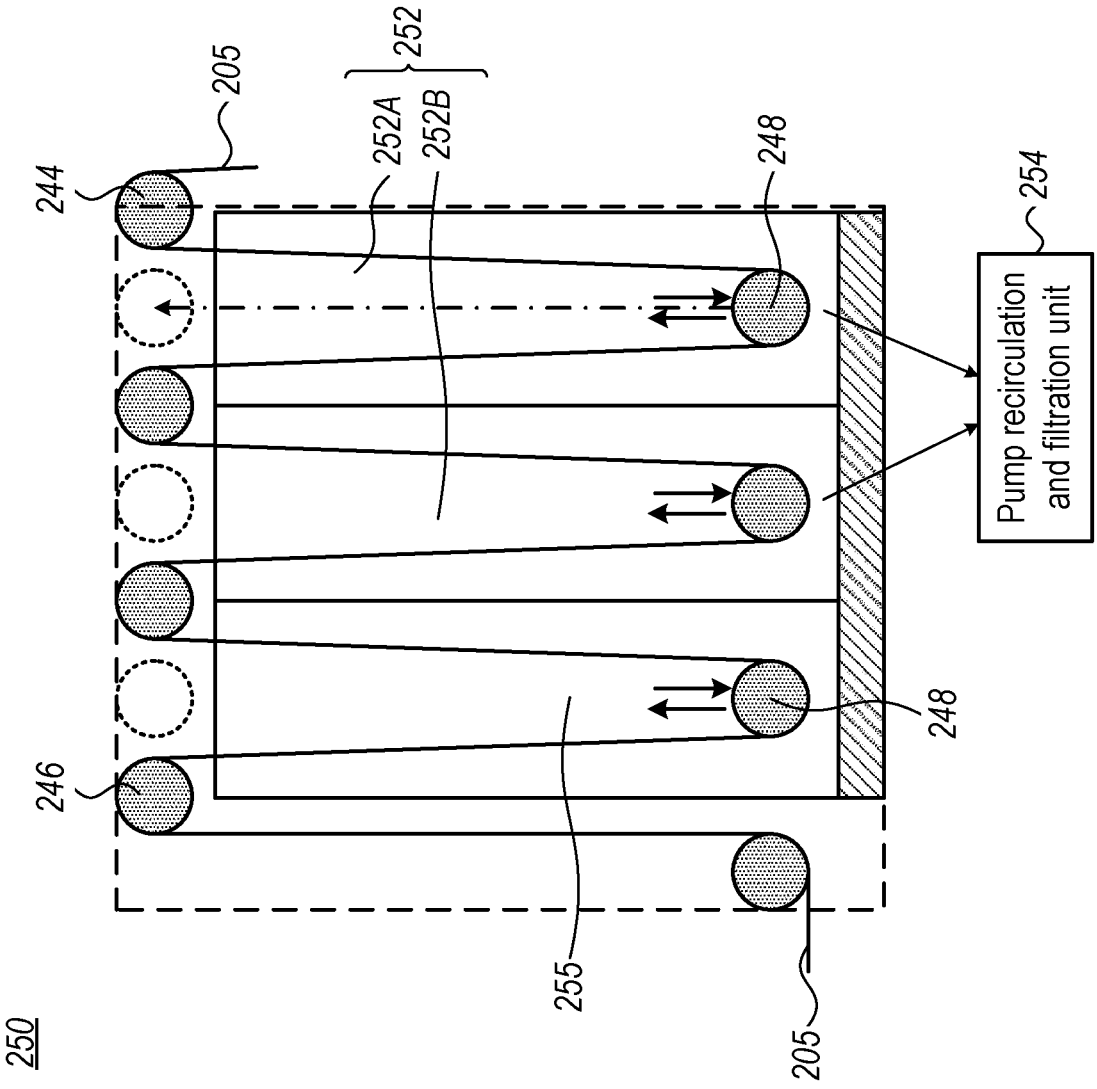
FIG. 4 is a high-level schematic illustration of a tape re-use unit, according to some embodiments of the invention.

FIG. 4 is a high-level schematic illustration of tape re-use unit 250, according to some embodiments of the invention. Tape cleaning unit 252 of tape re-use unit 250 may comprise a pre-cleaning compartment 252A and a cleaning compartment 252B configured to remove paste remains having different characteristics (e.g., pre-cleaning may remove rougher clumps of paste while cleaning may remove finer paste remains), and possibly may be preceded by a scraper device for removing paste smears. Tape cleaning may be carried out physically, e.g., by turbulent liquid flow, agitation, application of ultrasound, etc., and/or chemically, e.g., applying corresponding solvents. Fluid introduction to and removal from pre-cleaning compartment 252A and/or cleaning compartment 252B may be managed by a recirculation unit 254 (shown schematically), comprising, e.g., pump(s) and filter(s) for reusing respective cleaning solution(s). Tape drying unit 255 may follow tape cleaning unit 252 and be configured to dry tape 205 and prepare it for future use, prior to rolling tape 205 onto re-winding roll 242. Idle rolls 244, 246 and optionally additional rolls may be set to direct tape movement through and after tape re-use unit 250. During the tape segment advance movement, one or more idles rolls 248 shown in the bottom part of unit 250 may move upward enabling smooth tape movement and continuous tension control performing as dancers, similar to dancers 225, 245. After finishing the segment advance, rolls 248 may go downwards under their own weight. Alternatively or complementarily, tape re-use unit 250 may comprise one or more dancers configured to maintain the tension in tape 205 moving through tape re-use unit 250.

Figure 5A:
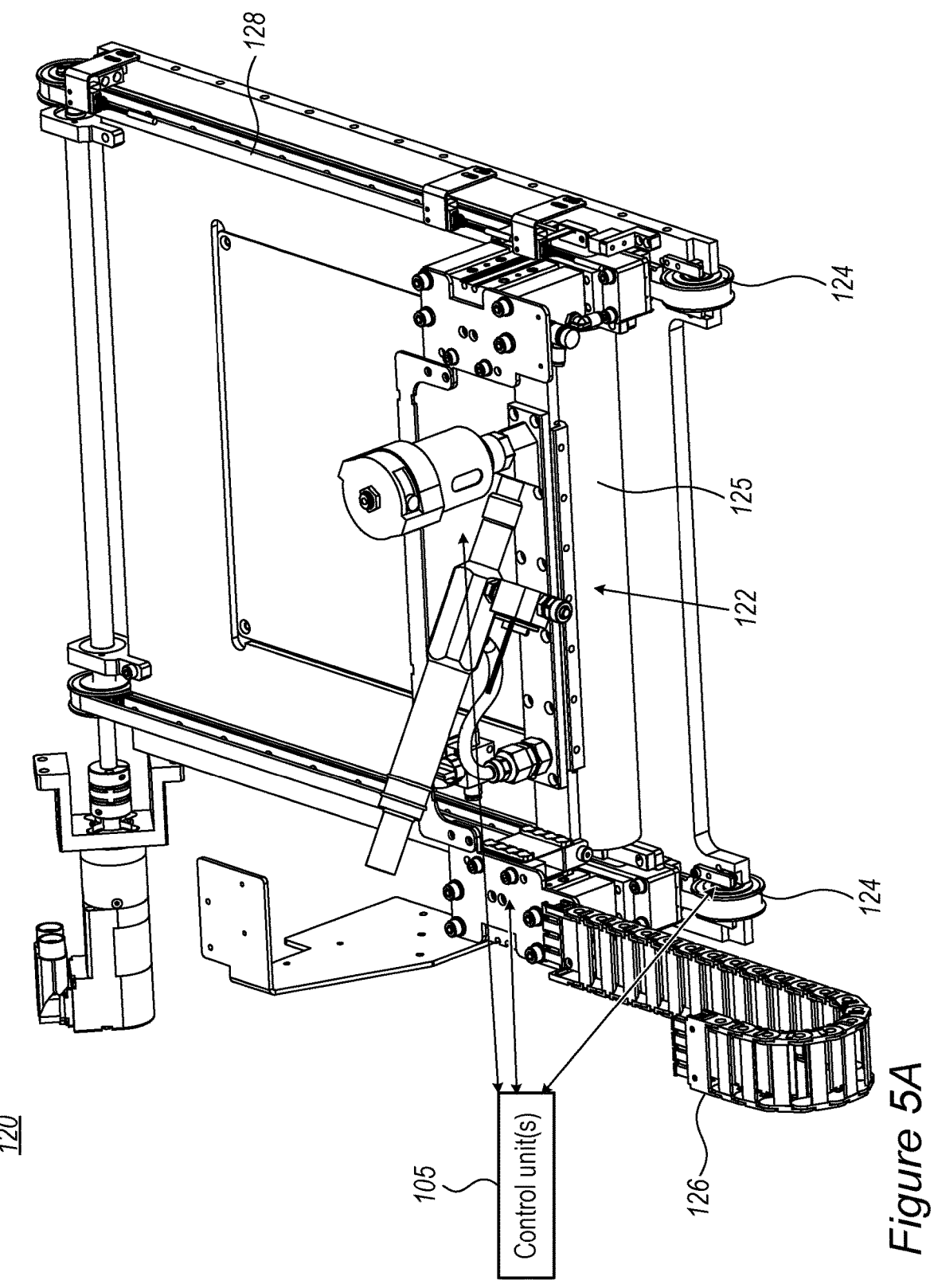
FIGS. 5A and 5B are high-level schematic illustrations of paste filling units, according to some embodiments of the invention.
Figure 5B:
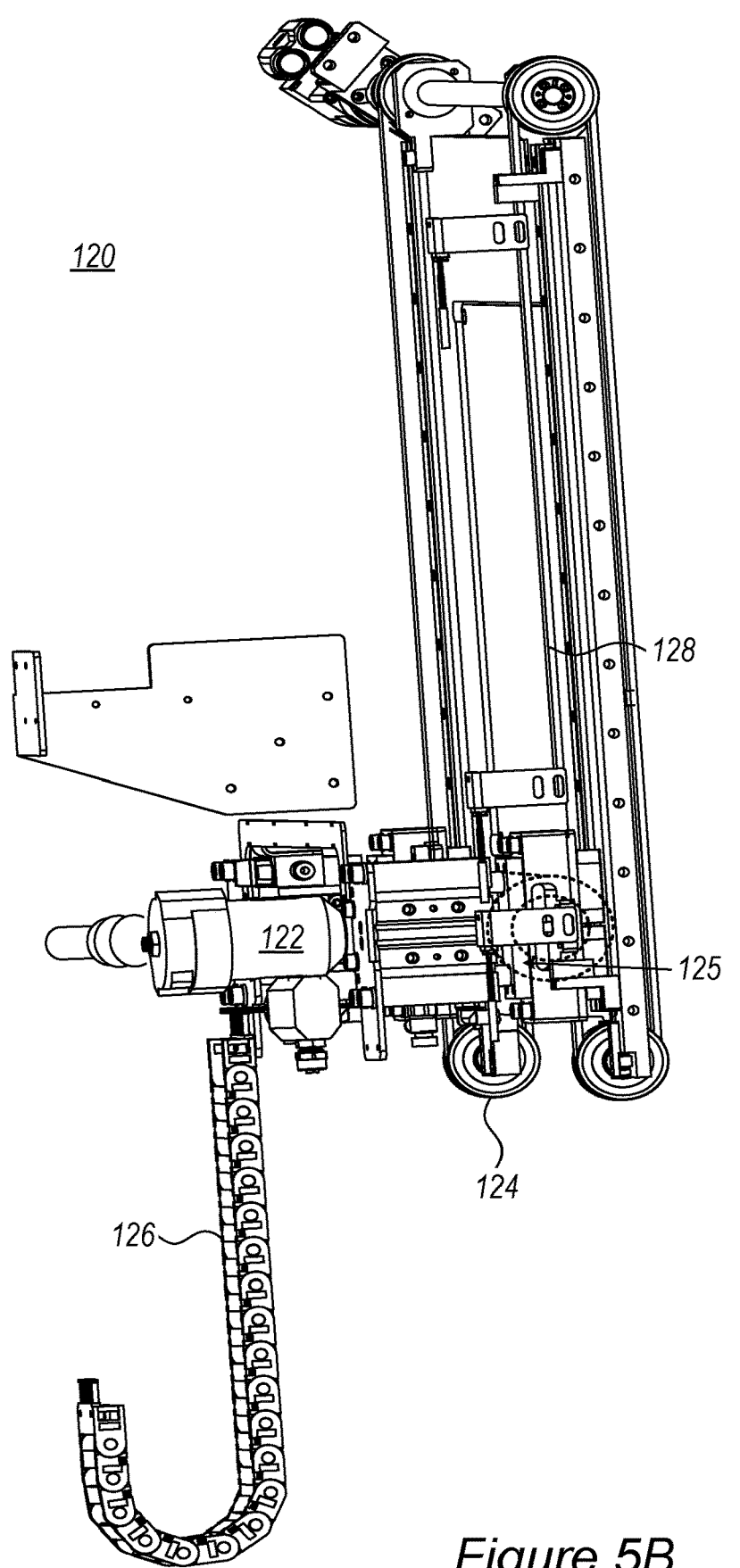
Figures 5C, 5D:
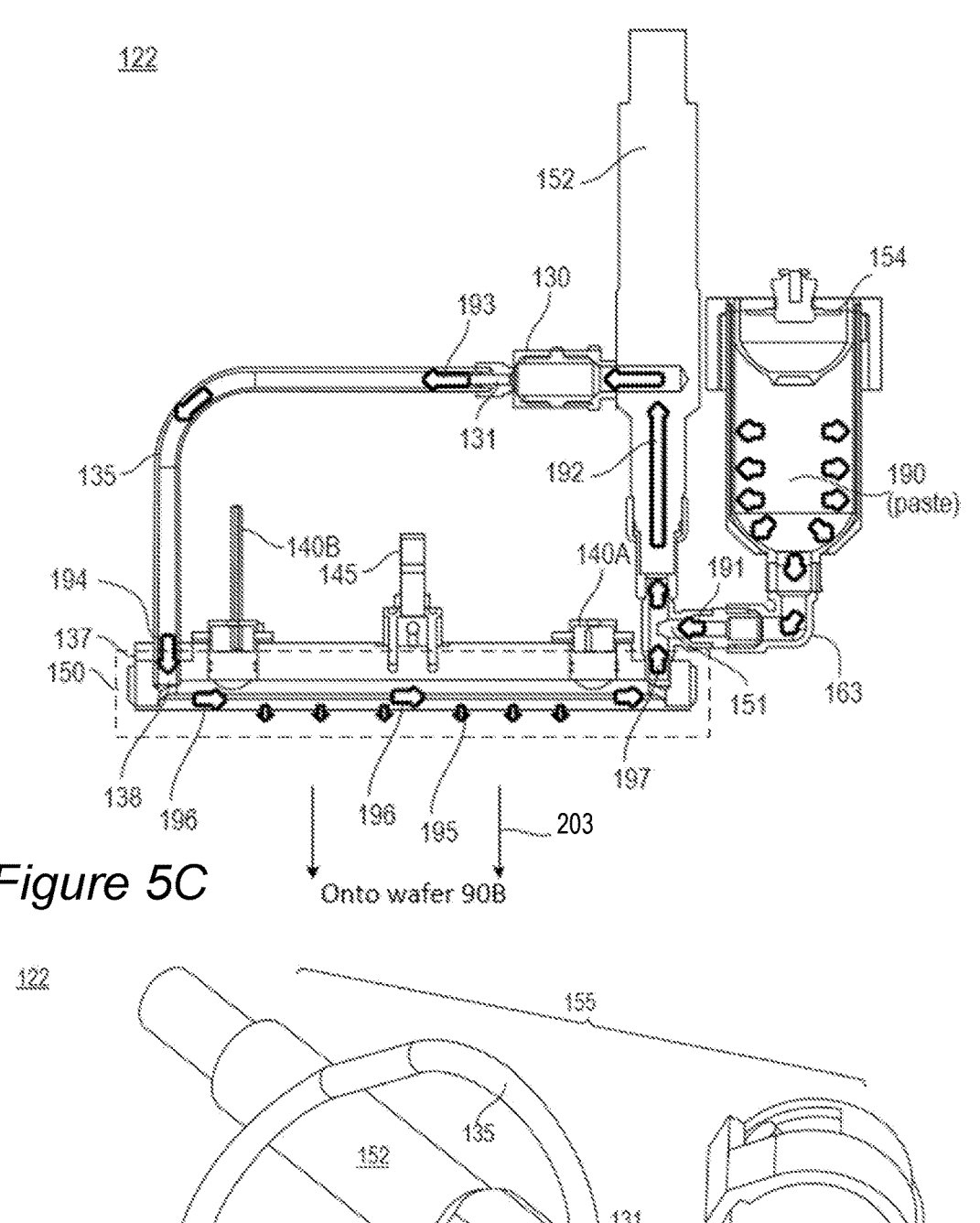
FIGS. 5C-5E are high-level schematic illustrations of printing heads, according to some embodiments of the invention
Figure 5E:
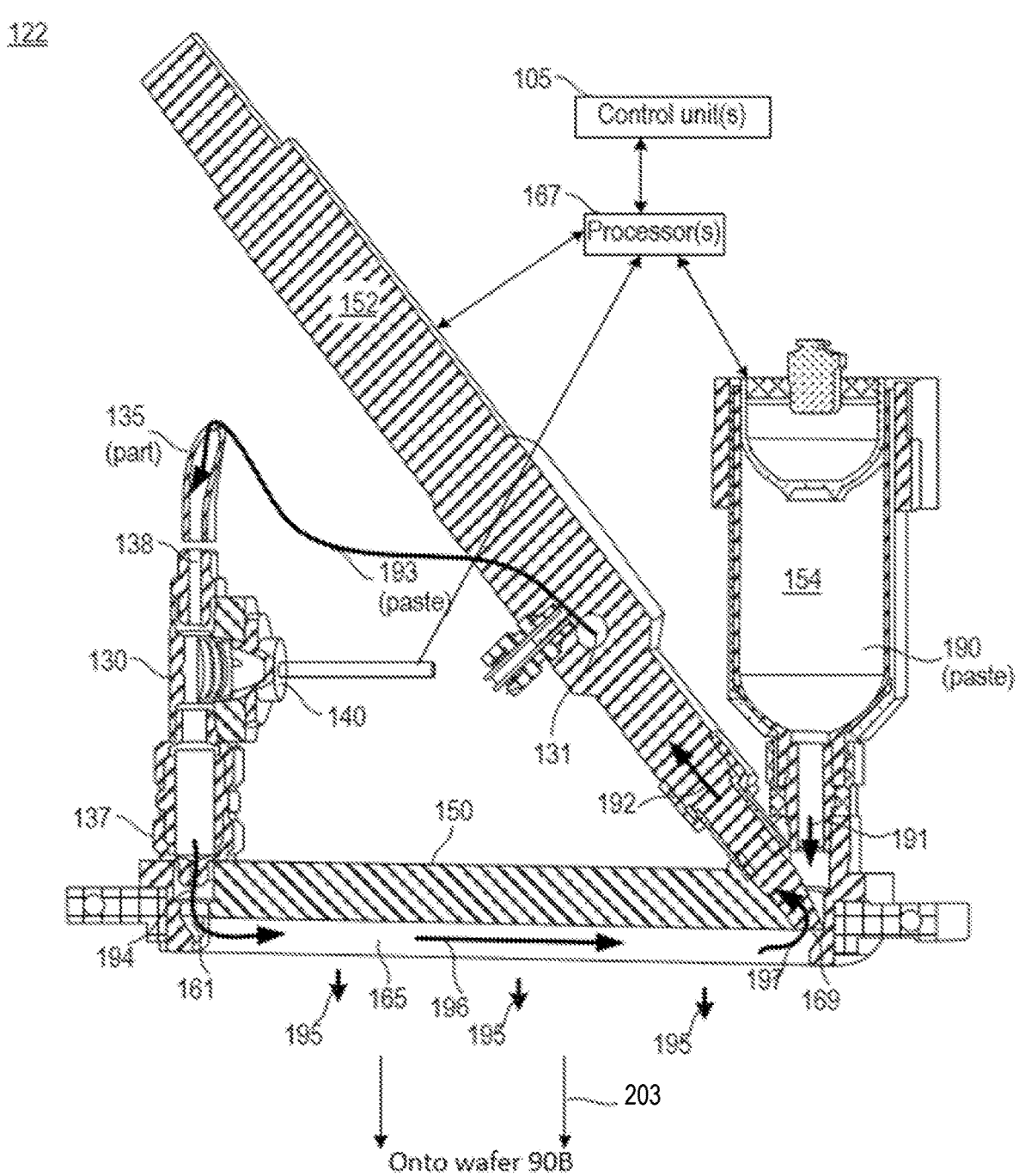

FIGS. 5A and 5B are high-level schematic illustrations of paste filling unit 120, according to some embodiments of the invention. FIG. 5A is a perspective view and FIG. 5B is a side view. FIGS. 5C-5E are high-level schematic illustrations of filling head 122, according to some embodiments of the invention. FIGS. 5C and 5E are schematic side view in cross section and FIG. 5D is a perspective view from below filling head 122.

As illustrated schematically in FIGS. 5A and 5B, paste filling unit 120 may comprise a frame on which paste filling head 122 and bottom roll 125 are mounted, and with respect to which they are moved simultaneously. Movements of the paste filling head assembly may be controlled by one or more control unit(s) 105 e.g., via controlling respective flexible rack 126 attached to paste filling head 122, drive motors 124 and/or gantry motion system 128.

Bottom roll 125 may be configured to counter paste filling head 122 and support pattern transfer sheet 205A of tape 205 during the filling of pattern transfer sheet 205A with the paste by paste filling head 122. Bottom roll 125 may be configured to roll during operation, possibly controllably.

Paste filling unit 120 may be configured to enable fast, uniform and accurate filling of the high viscosity paste into the trenches having a high aspect ratio. Paste filling unit 120 may be further configured to clean the surface of tape 205 after filling, e.g., disclosed in WIPO Publication No. 2015128857, which is incorporated herein by reference in its entirety.

As illustrated schematically in FIGS. 5C-5E, and disclosed in more details in Chinese Patent Applications Nos. 2021106730065 and 2021213505781, incorporated herein by reference in their entirety, filling head 122 of paste filling unit 120 may comprise at least two feeding openings 161, 169, an internal cavity 165 and at least one dispensing opening 160 that are in fluid communication (see, e.g., FIGS. 5D and 5E) and a pressurized paste supply unit 155 configured to circulate paste 190 through printing head 150. The pressure in the pressurized paste supply unit may be adjusted to maintain continuous circulation of the paste through feeding openings 161, 169 and internal cavity 165 and to control dispensing of the paste through dispensing opening(s) 160. For example, pressurized paste supply unit 155 may comprise a pressurized paste reservoir 154 and a paste pump 152 in fluid communication with internal cavity 165 of printing head 150, which are configured to circulate the paste therethrough. In non-limiting examples, paste pump 152 may comprise rotating pressure-tight displacement systems with self-sealing, rotor/stator designs for dispensing precise volumes such as eco-PEN450™ from Dymax™.

In various embodiments, paste filling unit 120 comprises at least one pressure sensor 140 configured to measure the pressure of the circulating paste, e.g., pressure sensor 140 illustrated schematically in FIGS. 5C-5E and associated with a paste mixer 130 or pressure sensors 140A, 140B illustrated schematically in FIG. 5C, at either ends of printing head 150, as non-limiting examples. Alternatively or complementarily, pressure measurement may be implemented within elements of pressurized paste supply unit 155, such as paste pump 152 and/or paste reservoir 154. Paste filling unit 120 may further comprise at least one processor 167 and/or controller (shown schematically in FIG. 5E), in communication with control unit(s) 105 and configured to adjust the pressure in pressurized paste supply unit 155 (or its components) with respect to the measured pressure of the circulating paste. Paste filling unit 120 may further comprise one or more paste mixer(s) 130 configured to mix the circulating paste. For example, paste mixer(s) 130 may be a static mixer, mixing the paste by utilizing its pressurization. In non-limiting examples, paste mixer(s) 130 may comprise plastic disposable static mixers such as GXF-10-2-ME™ from Stamixco™ made of large diameter plastic housing that includes multiple mixing elements.

Pressurized paste supply unit 155 may be further configured to introduce the paste into internal cavity 165 via at least one entry opening 161 of the at least two feeding openings and to receive the circulated paste via at least one exit opening 169 of the feeding openings in printing head 150. Typically, entry opening(s) 161 and exit opening(s) 169 are at the top of printing head 150, opposite to dispensing opening(s) 160 which faces the pattern transfer sheet with trenches which are to be filled by the paste. Alternatively or complementarily, entry opening(s) 161 and/or exit opening(s) 169 may be positioned on sides and/or extension(s) of printing head 150.

Pressurized paste supply unit 155 may comprise pressure-controlled paste reservoir 154, paste pump 152 and mixer 130 that are in fluid communication. Pressure-controlled paste reservoir 154 may be configured to deliver paste to paste pump 152, which may be configured to deliver the paste through mixer 130 to entry opening(s) 161. Pressurized paste supply unit 155 may be further configured to mix paste from exit opening(s) 169 with the paste delivered from pressure-controlled paste reservoir 154 to paste pump 152. For example, as illustrated schematically in FIGS. 5C and 5E, paste 190 in paste reservoir 154 may be delivered (191) to paste pump 152, mixing (192) with paste 197 exiting from exit opening(s) 169 of printing head 150, to be pumped by paste pump 152 into mixer 130. Paste 193 from mixer 130 may be delivered (194) to entry opening(s) 161 of printing head 150, wherein paste 196 moves along internal cavity 165 and some paste 195 may be dispensed through dispensing opening(s) 160 to form patterns on the transfer sheet 205A such as lines to be then printed (after the tape movement, from transfer sheet 205B) on the receiving substrate such as wafer 90 (e.g., silver lines of about 20 μm width on silicon wafers for PV cells, see, for non-limiting examples, Lossen et al. 2015). Remaining paste 197 is then mixed with paste 191 from paste reservoir 154 (e.g., delivered through nozzle 163 at junction 151) to compensate for the dispensed amount, and the paste is circulated through Paste filling unit 120 to maintain its mechanical characteristics and support continued mixing of the paste to maintain its uniform composition. In certain embodiments, paste filling unit 120 may be further configured to modify paste composition, e.g., by adding additives such as solvents to keep the paste homogenized, possibly in relation to the monitored pressures throughout paste filling unit 120. For example, additives such as solvents may be added to the paste entering mixer 130 if needed.

In various embodiments, printing head 150, internal cavity 165 and dispensing slit as opening 160 limited by slit edges 162 (e.g., metallic slit lips) may be elongated (see, e.g., FIG. 5D) and configured with respect to paste properties (e.g., viscosity values), specified throughput and specified features (e.g., length, width and optionally cross section) of the lines or other elements that are to be dispensed by printing head 150. In certain embodiments, dispensing opening 160 may comprise one or more slits, one or more opening, a plurality of linearly-arranged openings, e.g., one or more lines of circular or elliptical openings, and so forth.

In various embodiments, paste material may comprise conductive silver based metallic paste, and may typically be of high viscosity (e.g., in the range of several tens to several hundreds of Pa·s). For example, in non-limiting solar applications, the metallic paste may comprise metal powder(s), optional glass frits and modifier(s), volatile solvent(s) and non-volatile polymer(s) and/or or resin(s). A non-limiting example for the paste includes SOL9651B™ from Heraeus™.

Figure 10:
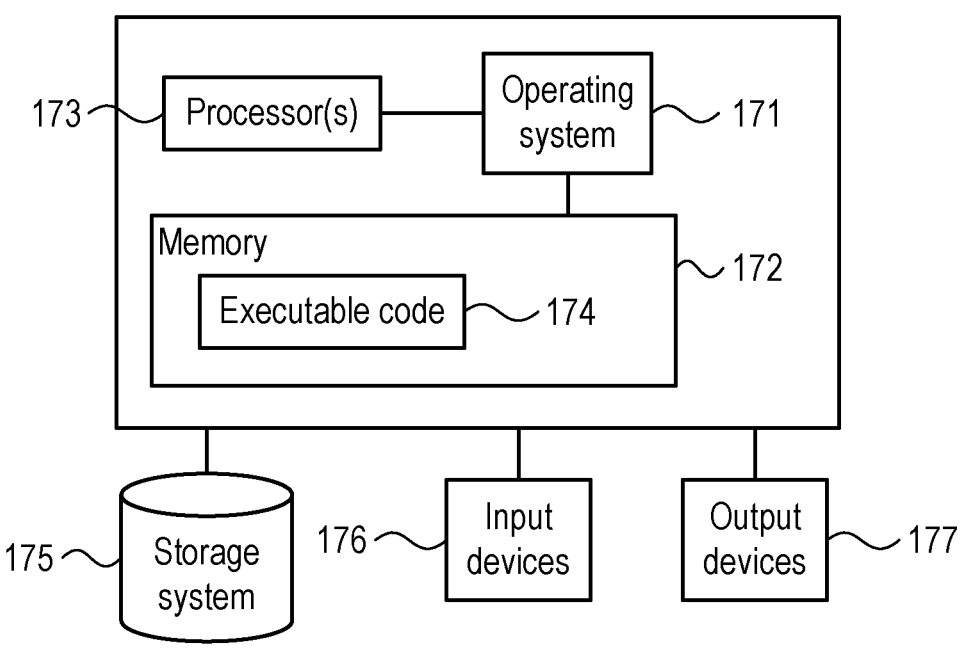
FIG. 10 is a high-level block diagram of exemplary computing device, which may be used with embodiments of the present invention.

Paste filling unit 120 may comprise one or more pressure sensor (s) 140, 140A, 140B configured to measure the pressure of the circulating paste at one or more respective locations along the paste circulation path. For example, pressure sensor(s) 140, 140A, 140B may be set adjacent to entry opening(s) 161, exit opening(s) 169, in fluid communication with internal cavity 165 of printing head 150 and/or in association with any of mixer 130, paste reservoir 154 and/or paste pump 152. Pressure-related indications from pressurized paste reservoir 154 and/or paste pump 152 may also be used to monitor paste circulation through Paste filling unit 120 and/or to monitor and possibly modify the paste properties such as its viscosity, e.g., by adding solvent. Paste filling unit 120 may further comprise at least one controller (e.g., as part of or in communication with control unit 105 and/or as at least one computer processor 173 as illustrated in FIG. 10), in communication with any of the components of paste filling unit 120, e.g., via communication link(s)) configured to adjust the pressure in pressure-controlled paste reservoir 154 and/or paste pump 152 with respect to the measured pressure of the circulating paste, e.g., as received from one or more pressure sensor (s) 140, 140A, 140B. In non-limiting examples, any of pressure sensor(s) 140 may comprise, e.g., small profile, media compatible, piezoresistive silicon pressure sensors packaged in a stainless-steel housing (e.g., MEAS 86A™ from T.E. Connectivity™ or equivalent sensors).

In various embodiments, pressure-controlled paste reservoir 154 and paste pump 152 may open adjacently to exit opening(s) 169 of printing head 150 and paste filling unit 120 may comprise a conduit 135 connecting the exit of mixer 130 to entry opening(s) 161 of printing head 150. In some embodiments, pressure-controlled paste reservoir 154 and paste pump 152 may open adjacently to exit opening(s) 169 of printing head 150, mixer 130 may be adjacent to entry opening(s) 161 of printing head 150, and conduit 135 may connect paste pump 152 to mixer 130. Pressure sensor 140 may be associated with mixer 130. The dimensions and orientations of paste reservoir 154 and paste pump 152 may vary, e.g., both paste reservoir 154 and paste pump 152 may be set perpendicularly to printing head 150 (see, e.g., FIG. 5C), or one or both of paste reservoir 154 and paste pump 154 may be set at an angle to printing head 150. For example, paste pump 152 may be set obliquely to spread its weight more evenly over printing head 150, as illustrated schematically in FIGS. 5D and 5E.

In various embodiments, conduit 135 may be adjusted to conform to any arrangement of paste reservoir 154, paste pump 152 and mixer 130, so as to make paste filling unit 120 more compact or adjust it to a given space and weight distribution requirements within the printing machine. Holder 145 (see, e.g., FIG. 5C) is illustrated schematically as an attachment element for attaching paste filling unit 120 to the printing machine (see, e.g., U.S. Pat. No. 9,616,524 for a non-limiting example). In non-limiting examples, conduit 135 may be connected between an opening 131 in mixer 130 and an opening 138 of connector 137 at entry opening 161 in printing head 150 (see, e.g., FIG. 5C) or between opening 131 in paste pump 152 and opening 138 in mixer 130 (see, e.g., FIG. 5E).

FIGS. 6A-6F are high-level schematic illustrations of wafer handling and positioning unit 400 and of its operation, according to some embodiments of the invention. FIG. 6A is a side view, FIG. 6B is a partial perspective view and FIG. 6C is a schematic illustration of the wafer handling. FIGS. 6D and 6E are top views of embodiments of wafer handling and positioning unit 400 and FIG. 6F is a bottom view of one of wafer holders 415 in wafer handling and positioning unit 400.

Wafer handling and positioning unit 400 is configured to increase the throughput of PTP system 100 by enabling parallel processing of different wafers 90. Wafer holders 415A, 415B (see FIG. 6B, 6F-6I, etc., e.g., vacuum chucks) may be configured to move in parallel (e.g., along the horizontal x axis and also along vertical z axis) and apply wafer position corrections during movements along the horizontal y axis and with respect the wafer's tilting angle (denoted $\theta$). For example, each stage 410A, 410B may be configured to adjust both wafer holders 415A, 415B (that may adjust the wafer positions) along the x-axis and the z axis. Correspondingly, wafer handling and positioning unit 400 may comprise one or more motors 413, e.g., a linear motor 413A (illustrated schematically, see also FIGS. 6D, 6E for other embodiments) for moving stage 410A along the x axis and a motor 418A (illustrated schematically) for adjusting the position of wafer stage 410A (with holders 415A and 415B) along the z axis. The positions along the y and $\theta$ axes are adjusted by each holder 415 separately. Accordingly, a linear motor 413B (illustrated schematically in FIG. 6B), which is mounted in parallel to motor 413A, moves stage 410B along x axis and motor 418B adjusts wafer stage 410B (holders 415A and 415B) along the z axis. Both stages 410A and 410B are operated in parallel along the x axis by motors 413A and 413B and are separated when moving in opposite directions by changing their z-position by motors 418A and 418B, accordingly.

In various embodiments, wafer handling and positioning unit 400 may be configured to have two stages working in parallel which are each movable along x and z directions. Each stage 410 may comprise two holders 415 for holding wafers 90, with each holder 415 ensuring wafer movement along the y and $\theta$ axes ($\theta$ denoting tilting of the wafer) thus enabling faster wafer handling and continuous wafers movements during the pattern transfer process. Multiple cameras may be configured to capture images of the incoming wafers to enable more accurate wafer alignment within the printing system thus more accurate alignment of printed conductive lines onto wafer pattern(s).

As illustrated schematically in FIGS. 6B and 6C, wafer handling and positioning unit 400 may be configured to move wafers 90 from input conveyor 412 to a similar conveyor 412A (wafer load position 90A) under a pre-alignment unit where wafers are loaded to stage 410. From this position, wafer stage 410 moves wafers 90 to pattern transfer unit 350 position (90B) and further to a wafer unload station 480, where wafers are unloaded to a belt conveyor (not shown, at wafer unload position 90C). From this position wafers are moved to an output conveyor 419, which may be combined with print quality unit 450 (indicated schematically). Wafers supported by either stage 410A, 410B are processed in parallel, e.g., during pattern transfer 90B to Wafer 1 (held by holder 415A) of Stage 1 (410A), Wafer 2 (held by holder 415B) of Stage 2 (410B) may already be pre-aligned (wafer 90A), while Wafers 1 and 2 (held by holders 415A, 415B, respectively) of Stage 1 (410A) are pre-aligned (90A) and printed (90B), respectively, Wafer 1 (held by holder 415A) of Stage 2 (410B) is unloaded (wafer 90C), etc. Wafer handling and positioning unit 400 may be mounted on a granite base 405 (see, e.g., in FIG. 6B) to stabilize all the modules and reduce inaccuracies that may result from frequent and fast movements of wafer stages and other moving parts.

Wafers 90 may be a silicon wafer, as used, e.g., for manufacturing PV cells of different types as described in detail, e.g., in Luque and Hegedus (eds.) 2011, Handbook of photovoltaic science and engineering, pages 276-277, incorporated herein by reference in its entirety.

It is noted that in embodiments illustrated, e.g., in FIGS. 6B and 6D, wafers 90 are delivered to wafer handling and positioning unit 400 from input belt conveyor 412, which may support wafers 90 by two belts from two opposite sides and move wafers 90 along the CMD. Coming from input conveyor 412, wafers 90 further move pairwise to a belt conveyor 412A (illustrated in FIG. 6D) located under wafer alignment unit 420. When the two wafers stop at the nominal position at wafer alignment unit 420, stage 410 with wafer holders 415, each having a vacuum chuck, moves from a bottom vertical position to an upper position, which is a bit higher than the level of the belts, and accepts the wafers on the chucks; in parallel the vacuum pumping is applied to the chucks so each wafer is clamped to the chuck planar surface. After completing the wafer measurement and alignment by wafer alignment unit 420, stage 410 with wafer holders 415 moves along the CMD very fast by linear motor 413B to the printing station at pattern transfer unit 350. After completion of the printing process by the laser scanner, stage 410 with wafer holders 415 delivers wafers 90 to an unload station 480 with belt conveyor 419A, on which wafers are unloaded from the holders on belts 419A. This conveyor moves the wafers to an output conveyor 419 located under print quality control unit 450. In parallel, stage 410 with wafer holders 415 returns to the initial CMD position to receive a new pair of wafers 90.

FIG. 6E illustrates schematically alternative embodiments to FIG. 6D, according to some embodiments of the invention. Advantageously, the chuck configurations may be modified to support a larger area of wafers 90 and enable to reach a minimal possible and uniform gap between the wafer and the respective tape segment in pattern transfer unit 350 to improve the print quality. For example, wafer holders 415

(and their vacuum chucks) may be configured to comprise protrusions 416 (fingers) from the central body of wafer holder 415, which are configured to support the margins of wafer 90 to enhance the holding stability of wafer holder 415 (see details in FIGS. 6F, 6H and 6I). To accommodate protrusions 416 during vertical movements of the wafer, a corresponding conveyor drive section 401 (e.g., at unload position 480 illustrated in FIGS. 6B, 6D and 6E) may be configured to include belts 407 with gaps 408 between them, which correspond to the locations of protrusions 416—to enable vertical motion of the wafer holder 415 through gaps 408 between belts 407. A similar arrangement of conveyor drive section 401 may be implemented at wafer alignment unit 420 as well, as illustrated schematically in FIG. 6E.

In FIG. 6F, conveyor drive section 401 is illustrated (in bottom view) with one wafer holder 415 at the top of the illustration and wafer 90 at the bottom of the illustration, for clarity reasons. Wafer handling and positioning unit 400 may comprise a mechanism for moving wafer holder 415, e.g., using conveyor motor 404 and a set of auxiliary belts 406 for transferring the movements from conveyor motor 404 to belts 407 and move wafer holder 415 with wafer 90. It is noted that belts 407 are below wafer 90 (FIG. 6F is a bottom view) and wafer holder 415 at the bottom part of the illustration is not shown for clarity reasons.

FIGS. 6G-6I are high-level schematic illustrations of wafer holders 415 with their vacuum chucks, according to some embodiments of the invention. FIGS. 6G and 6H are bottom views of different wafer holders 415, and FIG. 6I is a perspective top view of wafer holder 415 illustrates in FIG. 6H. Numeral 90 denotes the area of the wafer held by wafer holder 415. In contrast to wafer holder embodiments illustrated in FIG. 6G which support only a central portion of the wafer area, wafer holder embodiments illustrated in FIGS. 6F, 6H and 6I comprise protrusions 416 (fingers) from the central body of wafer holder 415, which are configured to support the margins of wafer 90 to enhance the planarity of clamped wafer 90. Protrusions 416 are accommodated by gaps 408 between belts 407. FIG. 6I further illustrates vacuum grooves 414 across wafer holder 415 that extend to protrusions 416 to support wafer 90 by vacuum applied through grooves 414.

It is noted that disclosed embodiments may also allow supporting larger wafers 90, e.g., wafer size of 210×210 mm and 230×230 mm, in addition to supporting 156×156 mm, 182×182 mm wafers. In certain embodiments, two halves of large wafers may be processed in parallel, and stage 410 may be configured to support four wafer holders 415, e.g., four chucks, one for each half portion of the wafer.

FIGS. 6J and 6K are high-level schematic illustrations of wafer alignment unit 420, according to some embodiments of the invention. Each wafer 90A may be identified by specified features thereof and its placement may be adjusted relative to the paste transfer printing unit according to the exact locations of the specified features. For example, selective emitter (SE) solar cells comprise localized lines (SE lines) of heavy doping in Si substrate onto which the metal contacts are printed by paste transfer. Wafer alignment unit 420 may be configured to measure the locations of the SE lines on wafer 90A and the position of the wafer may be adjusted so that the paste transfer for each printed finger is done by paste transfer unit 350 with respect to the positions of the SE lines, as determined by wafer alignment unit 420 in order to increase the overall printing accuracy.

Wafer alignment unit 420 may comprise one camera or camera array(s) 430 with associated illumination, configured to measure the locations of either the whole wafer perimeter or specific features on wafer 90A, e.g., alignment marks of the SE lines pattern. For example, wafer alignment unit 420 may comprise multiple imaging cameras configured to capture at least a part of a perimeter of wafer 90. The cameras of array(s) 430 may be configured to image the wafer corners (using e.g., three or four cameras for the areas near the wafer corners) as well as features at a middle of the wafer (using, e.g., two or more cameras to image areas including two opposite ends of the specific features, such as several trenches located in the middle of the wafer). In certain embodiments, a single camera may be used for imaging the full wafer perimeter, and be configured to have a high resolution sensor and a corresponding high resolution imaging lens.

In case of two wafer holders 415A, 415B with respective wafer per stage 410, camera arrays 430 may comprise two respective sub-arrays 430A, 430B, each comprising, e.g., two rows of cameras, configured to measure wafer 90A at the respective position (e.g., as Wafer 1 or Wafer 2, illustrated schematically in FIG. 6C). In non-limiting examples, each camera sub-array 430A, 430B may comprise six cameras 435 with respective illumination sources (e.g., four LEDs boards 422 per sub-array configured to provide uniform illumination of the camera's Field of View (FoV) with high contrast of the SE lines images)—which may be configured to provide accurate x and $\theta$ coordinates of the SE lines and the SE pitch even if the SE pitch is not uniform in the x direction (CMD).

Camera array(s) 430 may be mounted to the system chassis to ensure their stability and accuracy of the measurements. Processors 425 may receive the images from camera arrays 430, apply high resolution image processing algorithms to yield an accuracy of the SE line measurements of one to few microns, and provide the data to control unit(s) 105 to adjust the wafer position relative to paste transfer unit 350. Cameras 435 may be, for example, of 5 Mpix sensor of CMOS type, with an imaging lens, for example, of 25 mm focal length. It should be noted that number of cameras 435 in each array 430 affects the accuracy of wafer alignment to the transfer sheet pattern thus of the position of printed finger lines 92 onto SE lines on wafer 90B (see, e.g., FIG. 3E). As a non-limiting example, the number of cameras may be six thus enabling to determine accurate x, $\theta$-positions of the first and the last SE lines by four corner cameras as well as to estimate the SE pitch along the CMD by help of two intermediate cameras. In a non-limiting example, four LED boards 422 may be used to enable uniform illumination of FOVs of all the cameras by near-normal illumination, which enables high contrast imaging of the SE lines.

In various embodiments, camera array(s) 430 of wafer alignment unit 420 may comprise three or four corner cameras in each of sub-arrays 430A, 430B for accurately measuring the position and orientation of both the respective wafer and the SE lines pattern on it, e.g., using dedicated alignment marks near the corners. In various embodiments, camera array(s) 430 of wafer alignment unit 420 may comprise one or two additional cameras in the middle of the CMD side in each of sub-arrays 430A, 430B for detecting pitch non-uniformity of SE lines along the CMD (denoted as the x axis). In embodiments that lack SE lines, SE-measuring cameras may be omitted. In embodiments that do not require measurements at the center of the wafers, only corner cameras may be used. In embodiments that process half-wafers separately (e.g., for large wafers), four wafer holders 415 may be used per stage 410, and correspondingly a single camera or camera array 430 may be doubled to measure positions of four half-wafers simultaneously.

In certain embodiments, some or all of the cameras of camera array 430 may be replaced by a high-resolution camera covering the whole wafer area. The high-resolution camera may cover a sufficiently all the wafer edges, to enable determination of the wafer position and orientation according to the wafer edges (e.g., similarly to camera(s) 455 described in FIG. 8 for print quality control unit 450. For example, the high-resolution camera may comprise tens of megapixels (Mpix), e.g., 25 Mpix as in MV-CH250-90UM from Hikrobot with a corresponding high-resolution lens (e.g., MVL-KF1624M-25MP from Hikrobot). As non-limiting examples, camera array(s) 430 of wafer alignment unit 420 may comprise, e.g., 6, 4 or 3 cameras per wafer, which may be high-resolution cameras (e.g., 12Mpix camera CU120-10GM from Hikrobot), with a corresponding high resolution lenses)—to measure the wafer corners (e.g., by three or four cameras and optionally utilizing features within the wafer such as SE lines or SE alignment marks).

Figure 7A:
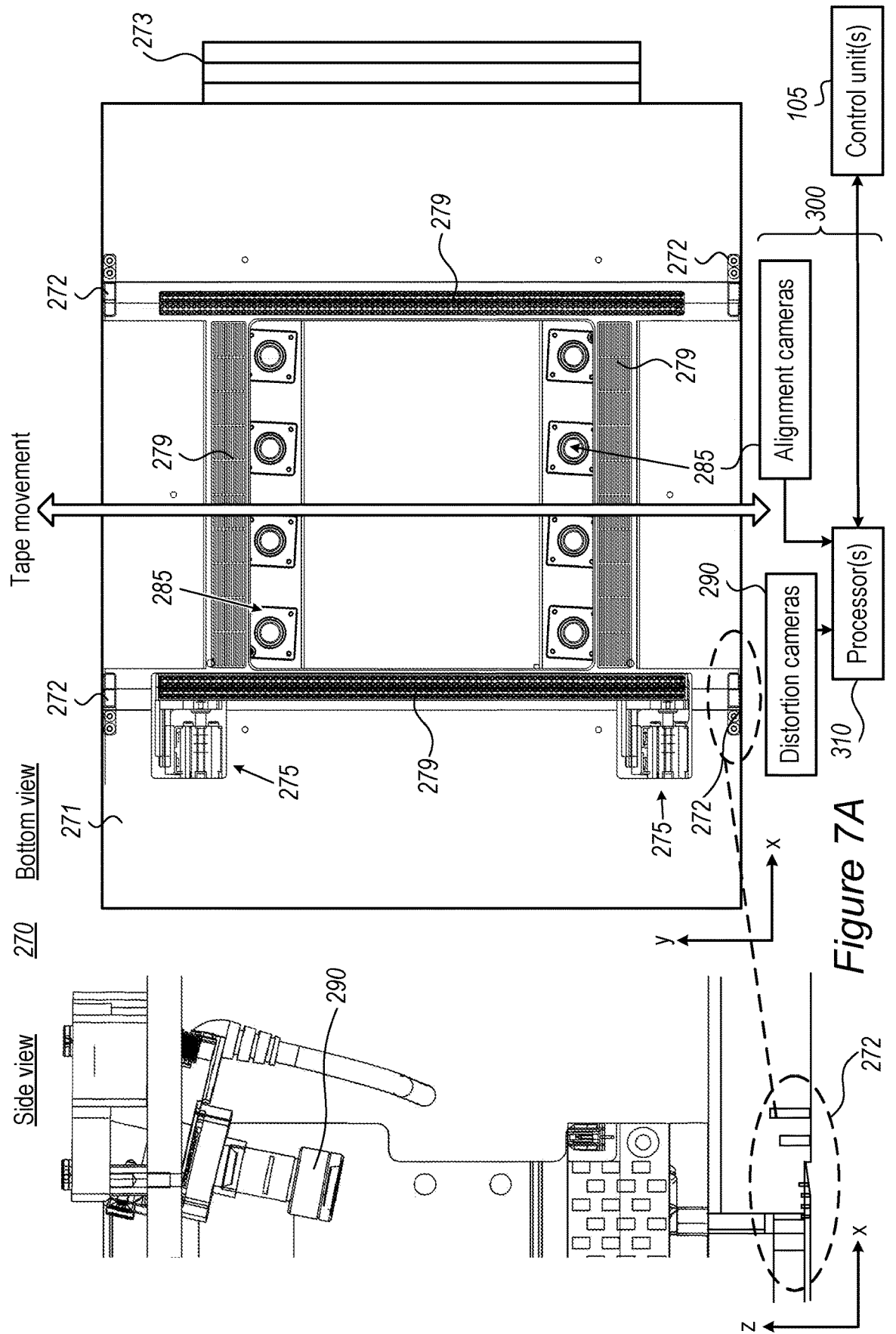
FIGS. 7A-7D are high-level schematic illustrations of tape stretching units and trench alignment monitoring units, according to some embodiments of the invention.
Figures 7B, 7C:
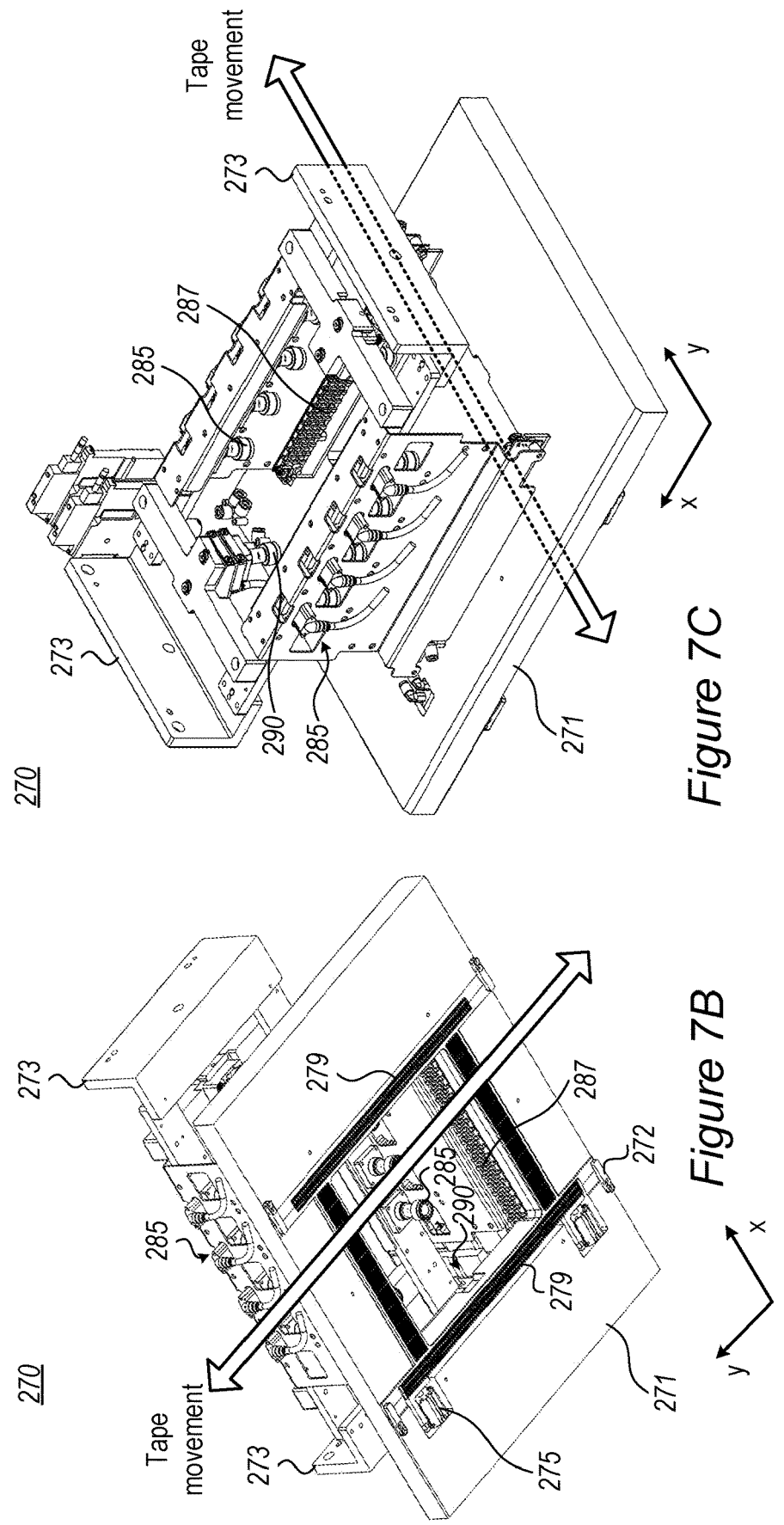

FIGS. 7A-7D are high-level schematic illustrations of tape stretching unit 270 and trench alignment monitoring unit 300, according to some embodiments of the invention. FIG. 7A is a front view (without tape 205) with an inset side view and FIGS. 7B and 7C are perspective views from below (facing the front of tape stretching unit 270) and from above (facing the back of tape stretching unit 270 and alignment monitoring unit 300). Tape stretching unit 270 and trench alignment monitoring unit 300 may be set with respect to plate 271 and secured by supports 273 to the frame of PTP system 100.

Tape stretching unit 270 may be configured to stretch tape 205 at the pattern transfer stage (e.g., pattern transfer sheet 205B) to keep pattern transfer sheet (tape segment) 205B straight and flat, avoiding deformations to the shape of paste-filled trenches thereupon and to prevent direct contact between pattern transfer sheet 205B and wafer 90B onto which the paste is transferred (e.g., keeping a gap of, e.g., in the range of 100 µm to 500 µm between pattern transfer sheet 205B and wafer 90B). Moreover, tape stretching unit 270 may be configured to avoid interference to wafer movements by wafer handling and positioning unit 400. For example, FIGS. 7A and 7B illustrate schematically the use of vacuum bars 279 configured to affix and flatten tape 205 using vacuum application and a stretching mechanism 275 and may comprise recesses 272 for applying vacuum to the transfer sheet by keeping its planarity.

Figure 7D:
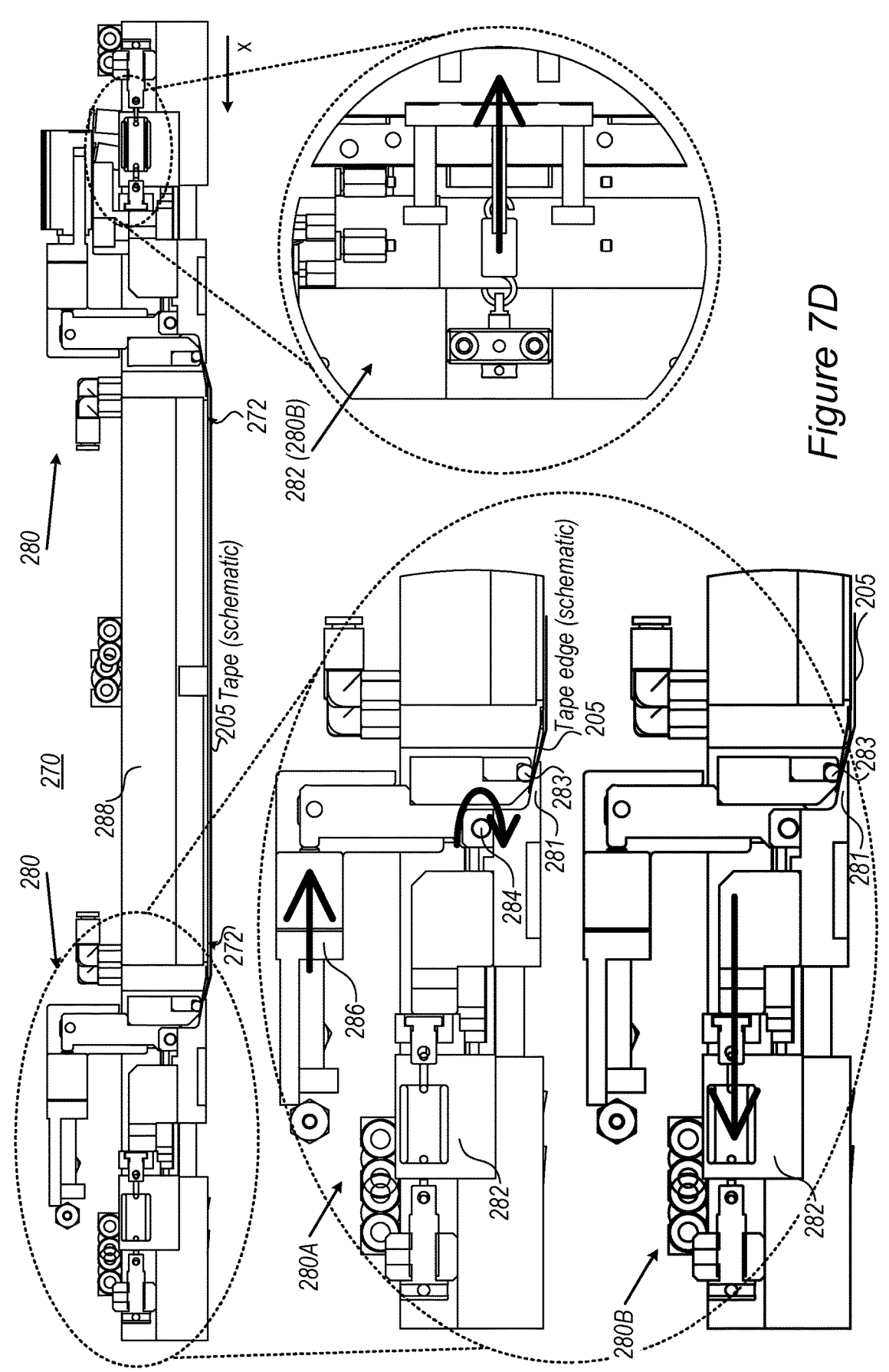

FIG. 7D illustrates schematically other embodiments of tape stretching unit 270, according to some embodiments of the invention. Tape stretching unit 270 may comprise, on either side of tape 205, a stretching unit 280 configured to stretch the respective edge of tape 205 to flatten and fix the filled tape segment before the laser alignment (by trench alignment monitor unit 300) and the print transfer process by the laser scanner (by pattern transfer unit 350). Stretching unit 280 may be configured to receive the edges of tape 205 into a bended gap between a pushing rod 283 and a counter plate 281 to affix both CMD sides of tape 205 and stretch them along the CMD (x axis) direction. Pushing rod 283 and tape holder counter plate 281 may be mechanically pressed against the tape edges, e.g., by a piston 286 that causes rotation around axis 284 to secure the tape edges between pushing rod 283 and counter plate 281 (stage 280A). Consecutively, the tape edges may be stretched by countering spring mechanisms 282 on either CMD side of the tape (stage 280B). Vacuum recesses 272 may be positioned along the edges to a tape segment holder 288 that supports the tape, and clamp and affix the area of the tape to holder 288. Advantageously, such designs allow applying stronger stretching forces along the CMD direction avoiding significant distortion and prevent tape slipping, while securing the tape at a flat state to the tape segment holder.

Trench alignment monitoring unit 300 may be configured to monitor the trenches' x, θ-positions and distortions, e.g., using multiple imaging cameras configured and/or located to capture ends of the trenches and to capture at least middle-sections of the trenches. For example, trench alignment monitoring unit 300 may be configured to measure the ends of the trenches using cameras 285 (e.g., four pairs of alignment cameras, one camera of each pair at each end of the trenches) as well as tilted cameras 290 (see, e.g., one of tilted cameras 290 illustrated FIG. 7C and in a larger scale on the left part side view in FIG. 7A)—set to measure trench distortions at central portions of the trenches. Tilted imaging cameras 290 may be tilted with respect to the vertical z direction so as to capture the middle-sections of the trenches without obstructing the illumination of the trenches (e.g., not positioned above the pattern transfer sheet). In certain embodiments, especially when only small trench distortions are assured (e.g., by tape stretching unit 270 of FIG. 7D), trench alignment monitoring unit 300 may be configured without tilted cameras 290 and comprise, e.g., eight cameras (e.g. four cameras on each MD side of the filled tape segment).

Corresponding image processing algorithms may be applied to the images of cameras 285, 290 in one or more processor(s) 310 associated with control unit(s) 105—to measure trench positions (e.g., x and θ-position(s)) and distortions, and optimize the positioning accuracy of laser beam 80 with respect to some or every paste-filled trench of pattern transfer sheet 205B during scanning. The measurements may be used to increase accuracy and/or to reduce the required beam width (wider beams 80 were previously used to compensate for inaccuracies). Trench alignment monitoring unit 300 may further comprise illumination unit(s), e.g., LED boards 287 (see, e.g., FIGS. 7B and 7C) located below the camera assemblies, configured to provide the required illumination of the trenches for the fields of view of respective cameras 285, 290. In certain embodiments, imaging cameras 285 and 290 may be assembled of the same CMOS camera and imaging lens as are used in the wafer alignment module.

Paste transfer unit 350 may comprise a high-power laser and optical head 355, which forms laser beam 80 that releases the paste from the trenches in pattern transfer sheet 205B onto wafer 90B. Optical head 355 may be movable and configured to be moved along CMD (x axis), e.g., with a velocity of about 0.5 m/s or more, with optical head 355 configured to focus laser beam 80 to specified spot shape(s) (that are effective in releasing the paste from the trenches of pattern transfer sheet 205B) and to move this spot in along MD (y axis) with very high velocity, e.g. 500 m/s. Optical head 355 may be movable along CMD (x axis), e.g., by a precise linear motor to adjust the exact location of laser beam 80 with respect to the actual locations of the trenches on the pattern transfer sheet 205B. Optical head 355 may be controllably tiltable (e.g., by the same or by an additional motor) to adjust for tilts of pattern transfer sheet 205B that may remain with disclosed tape stretching, and as measured by trench alignment monitoring unit 300. The laser used in pattern transfer unit 350 may be any of one of the following groups: a) CW, QCW, pulse; b) IR, NIR, Visible; c) solid state, fiber, gaseous, laser diode. The scanner for MD axis may be any commercially available linear scanner enabling the scanning velocity of several hundreds of m/sec. The motor assembly for CMD axis movement of optical head

355 may be based on a linear motor or a ball screw motor. Paste transfer unit 350 may be controllable by control unit(s) 105 with respect to the illumination and the various movement parameters, possibly adjusted and monitored by associated processor(s).

Figure 8:
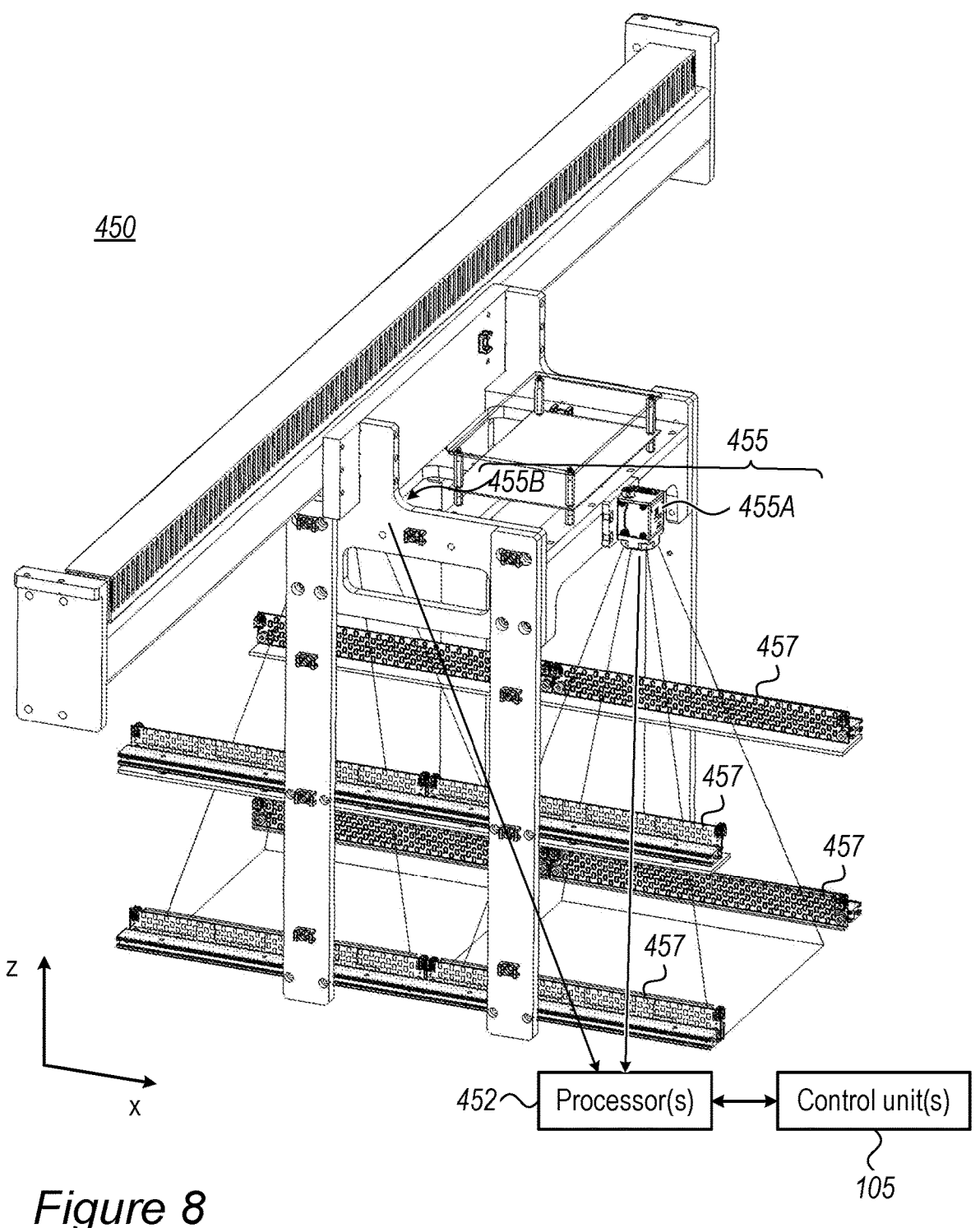
FIG. 8 is a high-level schematic illustration of a print quality control unit, according to some embodiments of the invention.

FIG. 8 is a high-level schematic illustration of print quality control (QC) unit 450, according to some embodiments of the invention. Print quality control unit 450 may be configured to detect defects in the pattern transfer using one or more cameras 455 configured to capture high resolution images (e.g., having 20 megapixels or more) of printed wafers 90C, with corresponding illumination 457 (e.g., four dark field LEDs boards along the x direction, CMD, configured to provide uniform illumination of whole wafer 90C). Print quality control unit 450 may be configured to provide high contrast and avoid or reduce optical noise.

Print QC unit 450 may comprise two respective cameras 455A, 455B (the latter indicated schematically by an arrow, cameras 455B are opposite to camera 455A but are not visible on FIG. 8, except for the schematic illustration of its FoV). Cameras 455 are configured to measure wafer 90C at the respective position (e.g., as Wafer 1 or Wafer 2, illustrated schematically in FIG. 6C). Processors 452 may receive the images from cameras 455, apply high resolution image processing algorithms to detect tiny printing defects like small cuts or local misprints, and provide the data to control unit(s) 105 to correct parameters of the process. Cameras 455A and 455B may be, in a non-limiting example, of 20Mpix CMOS type equipped with an imaging lens enabling FoV of about 230 mm by 230 mm. The LED boards may be installed on two sides and on two height levels in order to ensure uniform illumination of the whole wafer, as is shown schematically in FIG. 8.

Elements from FIGS. 1-8 may be combined in any operable combination, and the illustration of certain elements in certain figures and not in others merely serves an explanatory purpose and is non-limiting.

Figure 9B:
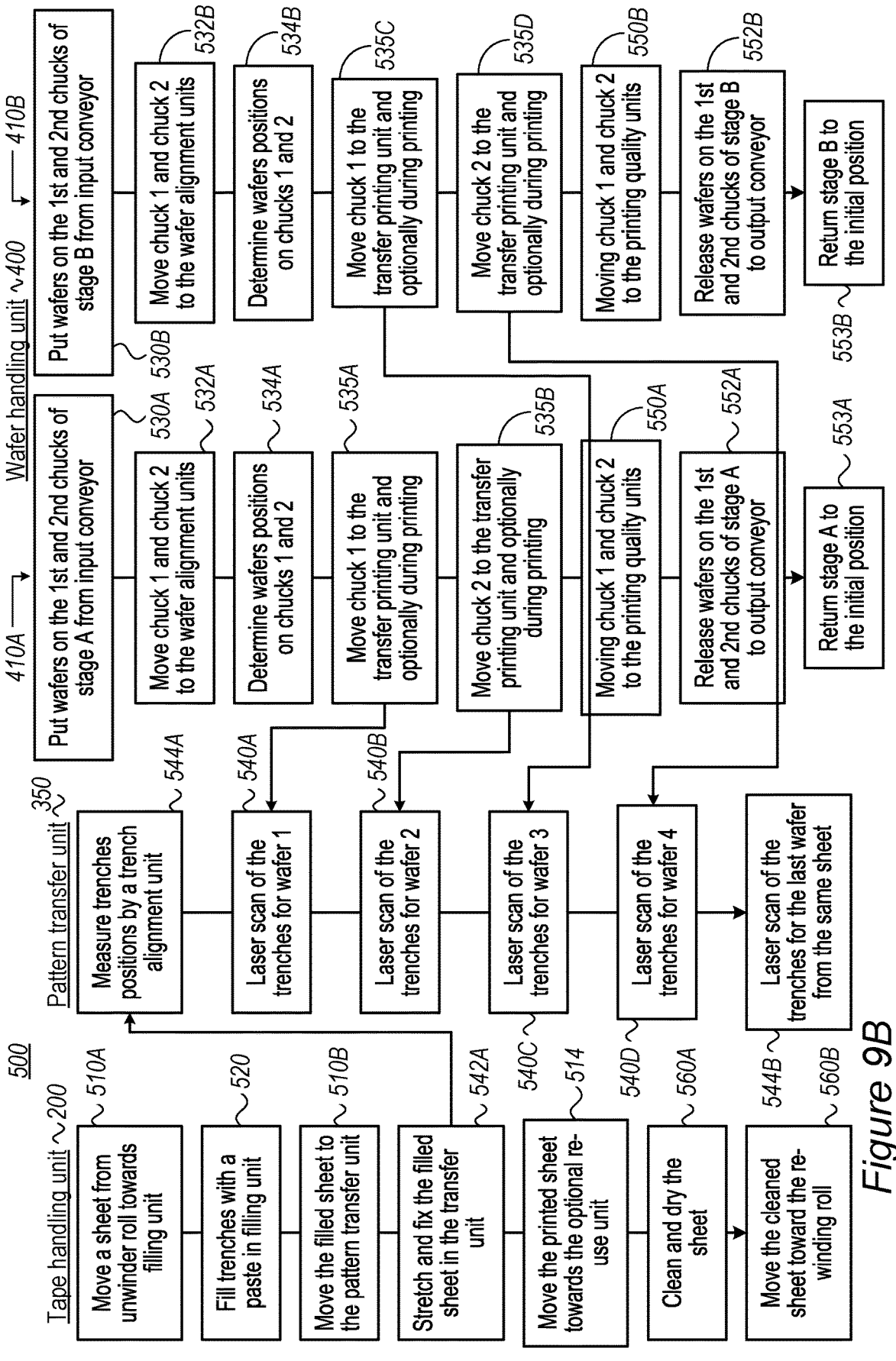
FIG. 9B is a high-level flowchart illustrating the parallel processes in the pattern transfer printing (PTP) method, according to some embodiments of the invention.

FIG. 9A is a high-level flowchart illustrating a pattern transfer printing (PTP) method 500, according to some embodiments of the invention. FIG. 9B is a high-level flowchart illustrating in general the parallel processes in pattern transfer printing (PTP) method 500, according to some embodiments of the invention. The method stages may be carried out with respect to PTP system 100 described above, which may optionally be configured to implement method 500. Method 500 may be at least partially implemented by at least one computer processor or by at least one control unit 105 (e.g., one or more personal computers, PCs and/or one or more programmable logic controllers, PLCs) or by their combinations). Certain embodiments comprise computer program products comprising a computer readable storage medium having computer readable program embodied therewith and configured to carry out the relevant stages of PTP method 500. PTP method 500 may comprise the following stages, irrespective of their order.

As illustrated in FIG. 9A, PTP method 500 may comprise handling a tape through a PTP system, the tape comprising, as sections thereof, a plurality of pattern transfer sheets having respective patterns of trenches—to controllably deliver the pattern transfer sheets for paste filling (stage 510), filling the trenches on the delivered pattern transfer sheets with conductive printing paste (stage 520), controllably delivering a plurality of wafers (one-by-one) for the pattern transfer (stage 530), and transferring the conductive printing paste from a plurality of filled trenches on the pattern transfer sheets onto a respective one of the delivered wafers, by releasing the printing paste from the trenches upon illumination by a laser beam, e.g., by help of two dimensional x, y-scanning (stage 540).

PTP method 500 may further comprise cleaning the pattern transfer sheets after the pattern transfer to provide reusable pattern transfer sheets, and optionally re-using the cleaned pattern transfer sheets (stage 560).

PTP method 500 may further comprise supporting a back side of the pattern transfer sheet by a countering moveable roll during the paste filling (stage 522). PTP method 500 may further comprise carrying out the trench filling at a nearly vertical position (stage 524), e.g., at a nearly vertical angle (in the range of 0-30° from the vertical x-z plane). For example, the paste filling unit and the pattern transfer sheet plane may be set at an angle deviating 0-30° from the vertical x-z plane.

PTP method 500 may further comprise delivering the wafers using two alternating stages, with each stage supporting two wafers (stage 532), controllably delivering the wafers for the pattern transfer at a close proximity (e.g., in a range of between 0.1 mm and 0.5 mm) to the pattern transfer sheet (stage 534) and carrying out the wafer measurement (before printing), pattern transfer onto a wafer (printing) and a print QC inspection (after printing) simultaneously for at least three of the wafers (stage 536), wherein at least two of the wafers are supported by the same stage. The wafers are then advanced by consecutively moving the stage along CMD. The stages may be alternated following the printed wafers release to the output conveyor, parallelizing the printing process to increase throughput. In certain embodiments, only two wafers (e.g., positioned on the same stage) are processed simultaneously, alternating between (i) wafer alignment (before printing) and pattern transfer onto a wafer (printing), and (ii) pattern transfer onto a wafer (printing) and the print QC inspection (after printing) for the respective pair of wafers.

PTP method 500 may further comprise affixing and flattening the respective pattern transfer sheet during the pattern transfer (stage 542), e.g., by two opposing stretching units along a cross-machine direction (CMD) direction, with each unit affixing the respective edge of the sheet and pulling onto it against the other unit. PTP method 500 may further comprise monitoring x,θ-positions of the trenches prior to the pattern transfer (stage 544), e.g., by eight or more cameras that image the trenches edges in the MD and optionally two additional tilted cameras for measuring the distortion of the trenches.

PTP method 500 may further comprise detecting and measuring features on the wafer and adjusting the pattern transfer accordingly (stage 546). For example, PTP method 500 may comprise detecting and measuring of features on the wafer and adjusting accordingly the transferring of the conductive printing paste from the pattern transfer sheets onto the delivered wafers, using a single imaging camera configured to capture a full perimeter of the wafer.

PTP method 500 may further comprise inspecting the printing quality of the transferred paste pattern (stage 550), e.g., by measuring an accuracy of the pattern transfer and/or detecting defects in the transferred pattern on the wafer As illustrated in FIG. 9B, PTP method 500 may comprise method stages implemented by tape handling unit 200, pattern transfer unit 350 and wafer handling and positioning unit 400, as illustrated schematically and described in detail herein.

PTP method 500 may comprise moving pattern transfer sheets from the unwinder roll towards the paste filling unit (stage 510A), the filling of the trenches with paste (stage 520), moving the filled sheets to the pattern transfer unit (stage 510B), e.g., stretching and affixing the filled sheets in the transfer unit (stage 542A), as disclosed herein. Following paste removal from the sheets, PTP method 500 may comprise moving the used sheets towards the re-use unit (stage 514), cleaning and drying the sheets (stage 560A) and moving the cleaned sheets toward the re-winding roll, possibly for future use (stage 560B).

PTP method 500 may further comprise measuring the positions of the trenches by the trench alignment unit (stage 544A), laser-scanning the trenches to transfer the paste to respective wafers 90 (stages 540A, 540B, 540C, 540D), as provided by the wafer handling and positioning unit, until the trenches from the same sheet are laser-scanned onto the last provided wafer (stage 544B).

PTP method 500 may further comprise handling the wafers using two stages 410A, 410B, which carry out the following stages, respectively: putting wafers on the wafer holders from the input conveyor (stages 530A, 530B), moving the wafers to the wafer alignment units (stages 532A, 532B), determining the wafer positions of the wafer holders (stages 534A, 534B), moving the wafer sequentially to the transfer printing unit, optionally during the printing of previous wafers (stages 535A, 535B and stages 535C, 535D, respectively for the two stages), and then moving the wafers to the print quality units (stages 550A, 550B), followed by releasing the wafers to the output conveyor (stages 552A, 552B) and returning the stages to their initial positions (stages 553A, 553B) to repeat stages 530-553.

Advantageously, disclosed PTP systems may be optimized to increase accuracy, efficiency and throughput by providing continuous handling of wafers during pattern transfer and using dual-chuck wafer stages, alignment of wafers by multiple cameras, more accurate alignment of transfer sheet by multiple cameras at the print position and locating the paste filling module at near vertical position thus reducing time between paste filling and pattern transfer.

FIG. 10 is a high-level block diagram of exemplary computing device 170, which may be used with embodiments of the present invention. Computing device 170 may include a controller or processor 173 that may be or include, for example, one or more central processing unit processor(s) (CPU), one or more Graphics Processing Unit(s) (GPU or general-purpose GPU—GPGPU), a chip or any suitable computing or computational device, an operating system 171, a memory 172, a storage system 175, input devices 176 and output devices 177. PTP system 100, control unit(s) 105, any of processors 310, 425, 452 and/or parts thereof may be or include a computer system as shown for example in FIG. 10. The processors may comprise multiple cores configured to enable parallel processing of different tasks, for example processing of images of all the cameras of the wafer alignment unit or/and of the trench monitoring units or/and of the print quality units.

Operating system 171 may be or may include any code segment designed and/or configured to perform tasks involving coordination, scheduling, arbitration, supervising, controlling, or otherwise managing operation of computing device 170, for example, scheduling execution of programs. Memory 172 may be or may include, for example, a Random-Access Memory (RAM), a read only memory (ROM), a Dynamic RAM (DRAM), a Synchronous DRAM (SD-RAM), a double data rate (DDR) memory chip, a Flash memory, a volatile memory, a non-volatile memory, a cache memory, a buffer, a short-term memory unit, a long-term memory unit, or other suitable memory units or storage units. Memory 172 may be or may include a plurality of possibly different memory units. Memory 172 may store for example, instructions to carry out a method (e.g., code 174), and/or data such as user responses, interruptions, etc.

Executable code 174 may be any executable code, e.g., an application, a program, a process, task or script. Executable code 174 may be executed by processor 173 possibly under control of operating system 171. For example, executable code 174 may when executed cause the production or compilation of computer code, or application execution such as VR execution or inference, according to embodiments of the present invention. Executable code 174 may be code produced by methods described herein. For the various modules and functions described herein, one or more computing devices 170 or components of computing device 170 may be used. Devices that include components similar or different to those included in computing device 170 may be used and may be connected to a network and used as a system. One or more processor(s) 173 may be configured to carry out embodiments of the present invention by for example executing software or code.

Storage system 175 may be or may include, for example, a hard disk drive, a floppy disk drive, a Compact Disk (CD) drive, a CD-Recordable (CD-R) drive, a universal serial bus (USB) device or other suitable removable and/or fixed storage unit. Data such as instructions, code, VR model data, parameters, etc. may be stored in a storage system 175 and may be loaded from storage system 175 into a memory 172 where it may be processed by processor 173. In some embodiments, some of the components shown in FIG. 10 may be omitted.

Input devices 176 may be or may include for example a mouse, a keyboard, a touch screen or pad or any suitable input device. It will be recognized that any suitable number of input devices may be operatively connected to computing device 170 as shown by block 176. Output devices 177 may include one or more displays, speakers and/or any other suitable output devices. It will be recognized that any suitable number of output devices may be operatively connected to computing device 170 as shown by block 177. Any applicable input/output (I/O) devices may be connected to computing device 170, for example, a wired or wireless network interface card (NIC), a modem, printer or facsimile machine, a universal serial bus (USB) device or external hard drive may be included in input devices 176 and/or output devices 177.

Embodiments of the invention may include one or more article(s) (e.g., memory 172 or storage system 175) such as a computer or processor non-transitory readable medium, or a computer or processor non-transitory storage medium, such as for example a memory, a disk drive, or a USB flash memory, encoding, including or storing instructions, e.g., computer-executable instructions, which, when executed by a processor or controller, carry out methods disclosed herein.

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function(s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A pattern transfer printing (PTP) system comprising:
a tape handling unit configured to handle a tape comprising, as sections thereof, a plurality of pattern transfer sheets having respective patterns of trenches, and to controllably deliver the pattern transfer sheets for paste filling and consecutively for pattern transfer,
a paste filling unit configured to fill the trenches on the delivered pattern transfer sheets with conductive printing paste,
a wafer handling and positioning unit configured to controllably deliver at least one wafer for the pattern transfer at a close proximity to the respective pattern transfer sheet,
a paste transfer unit configured to transfer the conductive printing paste from the pattern transfer sheets filled with the conductive printing paste onto the wafer delivered in position, by releasing the conductive printing paste from the trenches upon illumination by a laser beam,
wherein the tape handling unit is configured to move the tape from an unwinder roll to a re-winding roll in a step-and-repeat mode,
wherein the wafer handling and positioning unit comprises at least one stage enabling movement in x and z axes, each of the at least one stage comprising at least one holder, with each of the at least one holder supporting a respective at least one wafer and enabling wafer movement in y, $\theta$ axes, and
wherein the at least one holder comprises protrusions configured to support a margin of the respective wafer, and the wafer handling and positioning unit comprises a set of belts configured to accommodate the protrusions during vertical movements of the holder.

2. The PTP system of claim 1, wherein the paste filling unit comprises moveable paste filling head and a countering moveable roll configured to support a back side of the pattern transfer sheet during the paste filling.

3. The PTP system of claim 1, wherein the paste filling unit is set at an angle in the range of 0-30° relative to the vertical axis.

4. The PTP system of claim 1, further comprising a pattern transfer unit configured to control the illumination of the paste-filled trenches on the transfer sheet by the laser beam.

5. The PTP system of claim 4, wherein the illumination of the paste-filled trenches is done one-by-one by help of an optical head enabling fast laser scanning along a machine direction (MD) and movable along a cross-machine direction (CMD).

6. The PTP system of claim 1, further comprising a tape stretching unit configured to affix and flatten the respective pattern transfer sheet during the pattern transfer.

7. The PTP system of claim 1, further comprising a print quality control unit configured to detect defects of the transferred pattern on wafers.

8. A pattern transfer printing (PTP) system comprising:
a tape handling unit configured to handle a tape comprising, as sections thereof, a plurality of pattern transfer sheets having respective patterns of trenches, and to controllably deliver the pattern transfer sheets for paste filling and consecutively for pattern transfer,
a paste filling unit configured to fill the trenches on the delivered pattern transfer sheets with conductive printing paste,
a wafer handling and positioning unit configured to controllably deliver at least one wafer for the pattern transfer at a close proximity to the respective pattern transfer sheet,
a paste transfer unit configured to transfer the conductive printing paste from the pattern transfer sheets filled with the conductive printing paste onto the wafer delivered in position, by releasing the conductive printing paste from the trenches upon illumination by a laser beam,
wherein the tape handling unit is configured to move the tape from an unwinder roll to a re-winding roll in a step-and-repeat mode, and
wherein the PTP system further comprises a trench alignment monitoring unit configured to monitor a position and a distortion of the trenches prior to the pattern transfer.

9. The PTP system of claim 8, wherein the trench alignment monitoring unit comprises multiple imaging cameras configured to capture ends of the trenches and at least two tilted imaging cameras configured to capture at least middle-sections of the trenches, wherein the tilt is with respect to a vertical direction and is configured to capture the middle-sections of the trenches.

10. The PTP system of claim 8, further comprising a tape stretching unit configured to affix and flatten the respective pattern transfer sheet during the pattern transfer, wherein the tape stretching unit comprises along a cross-machine direction (CMD), two opposing stretching units configured to affix and stretch corresponding tape edges.

11. The PTP system of claim 8, wherein the tape handling unit is further configured to deliver the pattern transfer sheets one-by-one for the paste filling and/or for the pattern transfer.

12. The PTP system of claim 8, wherein the paste filling unit comprises moveable paste filling head and a countering moveable roll configured to support a back side of the pattern transfer sheet during the paste filling.

13. The PTP system of claim 8, wherein the paste filling unit is set at an angle in the range of 0-30° relative to the vertical axis.

14. The PTP system of claim 8, further comprising a pattern transfer unit configured to control the illumination of the paste-filled trenches on the transfer sheet by the laser beam.

15. The PTP system of claim 14, wherein the illumination of the paste-filled trenches is done one-by-one by help of an optical head enabling fast laser scanning along a machine direction (MD) and movable along a cross-machine direction (CMD).

16. The PTP system of claim 8, further comprising a wafer alignment unit configured to detect and measure features on the wafer and further adjust the wafer position in the pattern transfer unit accordingly.

17. The PTP system of claim 8, further comprising a print quality control unit configured to detect defects of the transferred pattern on wafers.

18. A pattern transfer printing (PTP) system comprising:

a tape handling unit configured to handle a tape comprising, as sections thereof, a plurality of pattern transfer sheets having respective patterns of trenches, and to controllably deliver the pattern transfer sheets for paste filling and consecutively for pattern transfer, a paste filling unit configured to fill the trenches on the delivered pattern transfer sheets with conductive printing paste, a wafer handling and positioning unit configured to controllably deliver at least one wafer for the pattern transfer at a close proximity to the respective pattern transfer sheet, a paste transfer unit configured to transfer the conductive printing paste from the pattern transfer sheets filled with the conductive printing paste onto the wafer delivered in position, by releasing the conductive printing paste from the trenches upon illumination by a laser beam, wherein the tape handling unit is configured to move the tape from an unwinder roll to a re-winding roll in a step-and-repeat mode, and wherein the PTP system further comprises a wafer alignment unit configured to detect and measure features on the wafer and further adjust the wafer position in the pattern transfer unit accordingly, wherein the wafer alignment unit comprises multiple imaging cameras configured to capture at least a part of a perimeter of the wafer.

19. The PTP system of claim 18, wherein the cameras are further configured to image the wafer corners and features at a middle of the wafer.

20. The PTP system of claim 18, wherein the wafer alignment unit comprises a single high-resolution imaging camera with a corresponding high-resolution lens, configured to capture a full perimeter of the wafer.

21. The PTP system of claim 18, wherein the paste filling unit comprises moveable paste filling head and a countering moveable roll configured to support a back side of the pattern transfer sheet during the paste filling.

22. The PTP system of claim 18, wherein the paste filling unit is set at an angle in the range of 0-30° relative to the vertical axis.

23. The PTP system of claim 18, further comprising a pattern transfer unit configured to control the illumination of the paste-filled trenches on the transfer sheet by the laser beam.

24. The PTP system of claim 23, wherein the illumination of the paste-filled trenches is done one-by-one by help of an optical head enabling fast laser scanning along a machine direction (MD) and movable along a cross-machine direction (CMD).

25. The PTP system of claim 18, further comprising a trench alignment monitoring unit configured to monitor a position and a distortion of the trenches prior to the pattern transfer.

26. The PTP system of claim 25, wherein the trench alignment monitoring unit comprises multiple imaging cameras configured to capture ends of the trenches and at least two tilted imaging cameras configured to capture at least middle-sections of the trenches, wherein the tilt is with respect to a vertical direction and is configured to capture the middle-sections of the trenches.

27. The PTP system of claim 18, further comprising a tape stretching unit configured to affix and flatten the respective pattern transfer sheet during the pattern transfer wherein the tape stretching unit comprises along a cross-machine direction (CMD), two opposing stretching units configured to affix and stretch corresponding tape edges.

28. The PTP system of claim 18, further comprising a print quality control unit configured to detect defects of the transferred pattern on wafers.

29. A pattern transfer printing (PTP) method comprising:

handling a tape comprising, as sections thereof, a plurality of pattern transfer sheets having respective patterns of trenches, to controllably deliver the pattern transfer sheets for paste filling and consecutively for pattern transfer, filling the trenches on the delivered pattern transfer sheets with conductive printing paste, controllably delivering a plurality of wafers for the pattern transfer, and transferring the conductive printing paste from the pattern transfer sheets onto the delivered wafers, by releasing the conductive printing paste from the trenches upon illumination by a laser beam, wherein the handling of the tape comprises moving the tape from an unwinder roll to a re-winding roll in a step-and-repeat mode, and wherein the PTP method further comprises monitoring of the positions of the trenches prior to the pattern transfer using multiple imaging cameras configured to capture ends of the trenches.

30. The PTP method of claim 29, further comprising at least one of:

monitoring a tension and a position of the tape, cleaning the pattern transfer sheets after the pattern transfer to provide reusable pattern transfer sheets, supporting a back side of the pattern transfer sheet by a countering moveable roll during the paste filling, affixing and flattening the pattern transfer sheet during the pattern transfer, monitoring positions of the trenches prior to the pattern transfer, detecting and measuring features on the wafer and adjusting accordingly the transferring of the conductive printing paste from the pattern transfer sheets onto the delivered wafers, and inspecting a quality of the transferred paste pattern.

31. The PTP method of claim 29, comprising the affixing and flattening the pattern transfer sheet along a cross-machine direction (CMD) by two opposing stretching units.

32. The PTP method of claim 29, further comprising monitoring distortions of the trenches prior to the pattern transfer using at least two tilted imaging cameras configured to capture at least middle-sections of the trenches, wherein the tilt is with respect to the vertical direction and is configured to capture the middle-sections of the trenches.

33. The PTP system of claim 29, further comprising a tape stretching unit configured to affix and flatten the respective pattern transfer sheet during the pattern transfer wherein the tape stretching unit comprises along a cross-machine direction (CMD), two opposing stretching units configured to affix and stretch corresponding tape edges.

* * * * *